US012695516B2

(12) United States Patent
Sugimoto et al.

(10) Patent No.: US 12,695,516 B2
(45) Date of Patent: Jul. 28, 2026

(54) RECEIVER CIRCUIT AND OPTICAL RECEIVER CIRCUIT

(71) Applicant: SUMITOMO ELECTRIC INDUSTRIES, LTD., Osaka (JP)

(72) Inventors: Yoshiyuki Sugimoto, Osaka (JP); Keiji Tanaka, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 439 days.

(21) Appl. No.: 18/545,182

(22) Filed: Dec. 19, 2023

(65) Prior Publication Data

US 2024/0214077 A1 Jun. 27, 2024

(30) Foreign Application Priority Data

Dec. 22, 2022 (JP) ................................. 2022-206029

(51) Int. Cl.
H03F 3/45 (2006.01)
H03F 3/26 (2006.01)
H04B 10/69 (2013.01)
(52) U.S. Cl.
CPC ......... H04B 10/6911 (2013.01); H03F 3/265 (2013.01); H03F 3/45636 (2013.01)
(58) Field of Classification Search
CPC . H04B 10/6911; H03F 3/265; H03F 3/45636; H03F 3/08; H03F 3/45183

USPC .................................. 330/252–261, 308, 297
See application file for complete search history.

(56) References Cited

U.S. PATENT DOCUMENTS 9,755,589 B2 * 9/2017 Oku ........................ H03G 9/025
2024/0195371 A1 * 6/2024 Ferriss ...................... G05F 1/56

FOREIGN PATENT DOCUMENTS

JP H10-224162 8/1998

* cited by examiner

*Primary Examiner* — Hieu P Nguyen
(74) *Attorney, Agent, or Firm* — IPUSA, PLLC

(57) ABSTRACT

A receiver circuit includes: a constant current circuit to generate second paired current signals according to first paired current signals; a current splitter circuit to output third differential signals having amplitudes smaller than the second paired current signals, from a first and second output nodes; first and second load resistor elements connected between a DC voltage node and the first and second output nodes, respectively; a differential transimpedance amplifier circuit to output paired voltage signals according to the third paired current signals, from first and second output terminals; and a voltage regulator circuit to adjust a gate voltage of an FET connected between a power supply wire and the DC voltage node, so as to reduce at least a difference in respective average potentials of the first and second output nodes and the first and second output terminals.

13 Claims, 14 Drawing Sheets

RECEIVER CIRCUIT AND OPTICAL RECEIVER CIRCUIT

CROSS-REFERENCE TO RELATED APPLICATION

The present application is based upon and claims priority under 35 U.S.C. § 119 to Japanese Patent Application No. 2022-206029 filed on Dec. 22, 2022, the entire contents of which are incorporated herein by reference.

TECHNICAL FIELD

The present disclosure relates to a receiver circuit and an optical receiver circuit.

BACKGROUND

Conventionally, as a variable gain amplifier circuit, a circuit using a Gilbert circuit has been known (e.g., see Japanese Laid-Open Patent Application No. H10-224162).

SUMMARY

According to an aspect in the present disclosure, a receiver circuit is provided that includes:

a constant current circuit that includes a first input node and a second input node into which first paired current signals are input, a first current source connected to the first input node, and a second current source connected to the second input node, wherein the receiver circuit is configured to generate second paired current signals according to the first paired current signals;

a current splitter circuit configured to generate third paired current signals from the second paired current signals, wherein the current splitter circuit includes a first output node and a second output node configured to output the third paired current signals, and sets amplitudes of the third paired current signals to be smaller than amplitudes of the second paired current signals according to a first control voltage and a second control voltage; a DC voltage node;

a load circuit that includes a first load resistor element and a second load resistor element, wherein the first load resistor element is connected between the DC voltage node and the first output node and the second load resistor element is connected between the DC voltage node and the second output node;

a differential transimpedance amplifier circuit that includes a third input node and a fourth input node into which the third paired current signals are input, a first output terminal and a second output terminal configured to output paired voltage signals, a first feedback resistor element connected between the third input node and the second output terminal, and a second feedback resistor element connected between the fourth input node and the first output terminal, to generate the paired voltage signals according to the third paired current signals; and a voltage regulator circuit that includes an FET connected between a power supply wire and the DC voltage node, and is configured to adjust a gate voltage of the FET so as to reduce at least a difference in respective average potentials of the first output node, the second output node, the first output terminal, and the second output terminal.

DETAILED DESCRIPTION

Description of Embodiments of Present Disclosure

Figure 1:
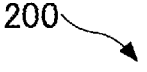
FIG. 1 is a diagram illustrating an example of a configuration of an optical receiver circuit according to an embodiment.
Figure 1:
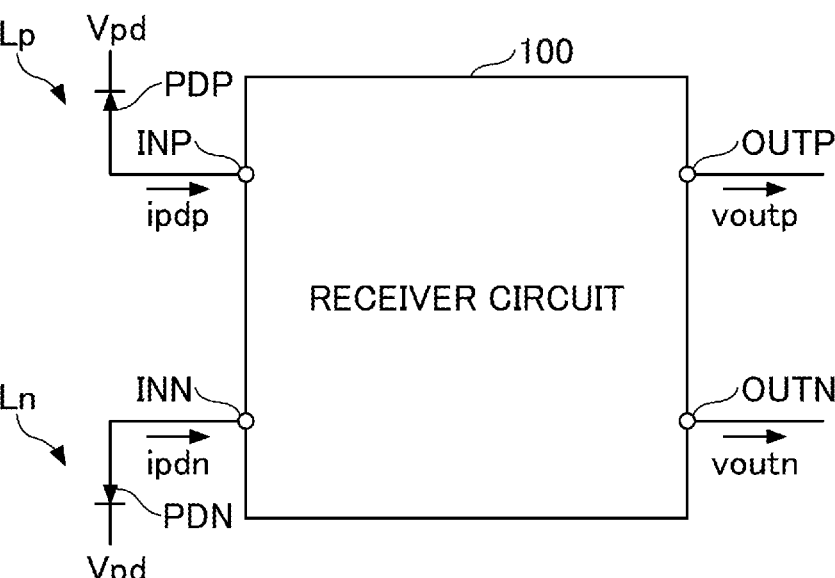

In a digital coherent optical transmission scheme used for long-distance optical communication, performance of amplifying an electric signal without distortion is required upon converting an optical signal into the electric signal in a wide optical input power range. Many receiver circuits have a variable gain mechanism to meet this requirement.

However, when the gain is varied, there may be cases where the frequency characteristics of the gain fluctuate. Fluctuation in the frequency characteristics may cause distortion of the electric signal.

The present disclosure provides a receiver circuit and an optical receiver circuit that can reduce the fluctuation of the frequency characteristics when changing the gain.

According to the present disclosure, the fluctuation of the frequency characteristics when changing the gain can be suppressed.

First, embodiments in the present disclosure will be enumerated and described.

(1) A receiver circuit according to a first aspect includes:

a constant current circuit that includes a first input node and a second input node into which first paired current signals are input, a first current source connected to the first input node, and a second current source connected to the second input node, wherein the receiver circuit is configured to generate second paired current signals according to the first paired current signals;

a current splitter circuit configured to generate third paired current signals from the second paired current signals, wherein the current splitter circuit includes a first output node and a second output node configured to output the third paired current signals, and sets amplitudes of the third paired current signals to be smaller than amplitudes of the second paired current signals according to a first control voltage and a second control voltage;

a DC voltage node;

a load circuit that includes a first load resistor element and a second load resistor element, wherein the first load resistor element is connected between the DC voltage node and the first output node and the second load resistor element is connected between the DC voltage node and the second output node;

a differential transimpedance amplifier circuit that includes a third input node and a fourth input node into which the third paired current signals are input, a first output terminal and a second output terminal configured to output paired voltage signals, a first feedback resistor element connected between the third input node and the second output terminal, and a second feedback resistor element connected between the fourth input node and the first output terminal, to generate the paired voltage signals according to the third paired current signals; and a voltage regulator circuit that includes an FET connected between a power supply wire and the DC voltage node, and is configured to adjust a gate voltage of the FET so as to reduce at least a difference in respective average potentials of the first output node, the second output node, the first output terminal, and the second output terminal.

According to (1), the difference in the respective average potentials of the first output node, the second output node, the first output terminal, and the second output terminal is reduced. Accordingly, deviation from the optimum value of the operating point of the differential transimpedance amplifier circuit is suppressed, and thereby, a receiver circuit that can suppress the fluctuation of the frequency characteristics when changing the gain can be provided.

(2) The above-described (1) may have a configuration, wherein the first current source supplies a first current, wherein the second current source supplies a second current, wherein the second current has a current value that is equivalent to a current value of the first current, wherein the second load resistor element has a resistance value equivalent to a resistance value of the first load resistor element, wherein the differential transimpedance amplifier circuit further includes a third current source, a third load resistor element, and a fourth load resistor element, wherein the third current source supplies a third current, wherein the fourth load resistor element has a resistance value equivalent to a resistance value of the third load resistor element, and wherein the third current is equivalent to a sum of an average current flowing through the third load resistor element and an average current flowing through the fourth load resistor element.

According to (2), the third current is equivalent to the sum of the average current flowing through the third load resistor element and the average current flowing through the fourth load resistor element. Accordingly, deviation from the optimum value of the operating point of the differential transimpedance amplifier circuit is further suppressed, and thereby, the fluctuation of the frequency characteristics when changing the gain can be further suppressed.

(3) The above-described (1) or (2) may have a configuration, wherein the differential transimpedance amplifier circuit further includes a fifth load resistor element, and wherein the fifth load resistor element has one end connected to the third load resistor element and the fourth load resistor element, and has another end connected to the power supply wire.

According to (3), the fifth load resistor element has its one end connected to the third load resistor element and the fourth load resistor element, and has the other end connected to the power supply wire. Accordingly, by the resistance value of the fifth load resistor element, the average current flowing through the third load resistor element and the average current flowing through the fourth load resistor element can be set to desired values.

(4) A receiver circuit according to a second aspect includes:

a first input node;

a second input node;

a constant current circuit that includes a first transistor and a second transistor, wherein the first input node is connected to a collector of the first transistor, and the second input node is connected to a collector of the second transistor;

a DC voltage node;

a current splitter circuit that includes a third transistor, a fourth transistor, a fifth transistor, and a sixth transistor, wherein an emitter of the third transistor and an emitter of the fourth transistor are connected to the first input node, an emitter of the fifth transistor and an emitter of the sixth transistor are connected to the second input node, a collector of the fourth transistor and a collector of the fifth transistor are connected to the DC voltage node, a base of the third transistor and a base of the sixth transistor receive a first control signal, and a base of the fourth transistor and a base of the fifth transistor receive a second control signal;

a load circuit that includes a first load resistor element and a second load resistor element, wherein the first load resistor element is connected between the DC voltage node and a collector of the third transistor, and the second load resistor element is connected between the DC voltage node and a collector of the sixth transistor;

a differential transimpedance amplifier circuit that includes a seventh transistor, an eighth transistor, a ninth transistor, a first feedback resistor element, a second feedback resistor element, a third load resistor element, a fourth load resistor element, and a fifth load resistor element, wherein a base of the seventh transistor is connected to the first load resistor element, a base of the eighth transistor is connected to the second load resistor element, an emitter of the seventh transistor and an emitter of the eighth transistor are connected to a collector of the ninth transistor, the first feedback resistor element is connected between a collector and the base of the seventh transistor, the second feedback resistor element is connected between a collector and the base of the eighth transistor, the third load resistor element is connected between the fifth load resistor element and the seventh transistor, and the fourth load resistor element is connected between the fifth load resistor element and the eighth transistor;

a first output terminal connected to the collector of the eighth transistor;

a second output terminal connected to the collector of the seventh transistor; and a voltage regulator circuit that includes an FET connected between a power supply wire and the DC voltage node, and is configured to adjust a gate voltage of the FET so as to reduce at least a difference in respective average potentials of the collector of the third transistor, the collector of the sixth transistor, the collector of the seventh transistor, and the collector of the eighth transistor.

According to (4), the difference in the respective average potentials of the collector of the third transistor, the collector of the sixth transistor, the collector of the seventh transistor, and the collector of the eighth transistor is reduced. Accordingly, deviation from the optimum value of the operating point of the differential transimpedance amplifier circuit is suppressed, and thereby, a receiver circuit that can suppress the fluctuation of the frequency characteristics when changing the gain can be provided.

(5) Any one of (1) to (4) described above may have a configuration, wherein the voltage regulator circuit includes a first input resistor element, a second input resistor element, a third input resistor element, a fourth input resistor element, and an operational amplifier, wherein the first input resistor element is connected between the collector of the third transistor and a non-inverted input terminal of the operational amplifier, wherein the second input resistor element is connected between the collector of the sixth transistor and the non-inverted input terminal of the operational amplifier, wherein the third input resistor element is connected between the collector of the eighth transistor and an inverted input terminal of the operational amplifier, wherein the fourth input resistor element is connected between the collector of the seventh transistor and the inverted input terminal of the operational amplifier, and wherein an output of the operational amplifier is electrically connected to a gate of the FET.

According to (5), the difference in the respective average potentials of the collector of the third transistor, the collector of the sixth transistor, the collector of the seventh transistor, and the collector of the eighth transistor can be detected with high accuracy. The gate voltage of the FET is adjusted so as to make the detection value of the difference small, and thus, the deviation of the operating point of the differential transimpedance amplifier circuit from the optimum value is further suppressed. Therefore, the fluctuation of the frequency characteristics when changing the gain is further suppressed.

(6) Any one of (1) to (5) described above may have a configuration, wherein the differential transimpedance amplifier circuit has an input impedance lower than resistance values of the first load resistor element and the second load resistor element.

According to (6), the load capacitance of the current splitter circuit is lowered, the degradation of the frequency characteristics of the current gain is suppressed, and further, the fluctuation of the frequency characteristics when changing the current gain is suppressed.

(7) Any one of (1) to (6) described above may further include:

a reference voltage circuit configured to generate a reference voltage;

a current pull-out circuit that includes a first pull-out current source connected to a first input terminal connected to the first input node and a second pull-out current source connected to a second input terminal connected to the second input node, wherein the first pull-out current source pulls out a first feedback current from the first current signal input from the first input terminal, and the second pull-out current source pulls out a second feedback current from the second current signal input from the second input terminal; and a feedback control circuit configured to control pulling out the first feedback current and the second feedback current so as to make a DC voltage of the first input terminal and a DC voltage of the second input terminal equivalent to the reference voltage.

According to (7), the direct current components included in the first current signal and the second current signal are reduced. Accordingly, the deviation of the operating point of the differential transimpedance amplifier circuit from the optimum value is suppressed, and thereby, the fluctuation of the frequency characteristics when changing the gain can be more suppressed.

(8) The above-described (4) or (5) may further include a reference current circuit configured to generate a reference current, wherein the reference current circuit supplies a bias voltage to a base of the first transistor, a base of the second transistor, and the base of the third transistor.

According to (8), a common bias voltage is supplied to the base of the first transistor, the base of the second transistor, and the base of the third transistor. Accordingly, the deviation of the operating point of the differential transimpedance amplifier circuit from the optimum value is suppressed, and thereby, the fluctuation of the frequency characteristics when changing the gain can be more suppressed.

(9) The above-described (8) may have a configuration, wherein the reference current circuit includes a tenth transistor, wherein a collector of the tenth transistor is connected to a base of the tenth transistor, and wherein the base of the tenth transistor is connected to the base of the first transistor, the base of the second transistor, and the base of the third transistor.

According to (9), each of the first transistor, the second transistor, and the third transistor can form a current mirror circuit in relation to the tenth transistor. Accordingly, the deviation of the operating point of the differential transimpedance amplifier circuit from the optimum value is suppressed, and thereby, the fluctuation of the frequency characteristics when changing the gain can be more suppressed.

(10) The above-described (8) may further include:

a reference voltage circuit configured to generate a reference voltage according to the bias voltage;

a current pull-out circuit that includes a first pull-out current source connected to a first input terminal connected to the first input node and a second pull-out current source connected to a second input terminal connected to the second input node, wherein the first pull-out current source pulls out a first feedback current from the first current signal input from the first input terminal, and the second pull-out current source pulls out a second feedback current from the second current signal input from the second input terminal; and a feedback control circuit configured to control pulling out the first feedback current and the second feedback current so as to make the DC voltage of the first input terminal and the DC voltage of the second input terminal equivalent to the reference voltage.

According to (10), the direct current components included in the first current signal and the second current signal are reduced. Accordingly, the deviation of the operating point of the differential transimpedance amplifier circuit from the optimum value is suppressed, and thereby, the fluctuation of the frequency characteristics when changing the gain can be more suppressed.

(11) The above-described (10) may have a configuration,
wherein the reference voltage circuit includes an eleventh transistor and a twelfth transistor,
wherein a base of the eleventh transistor is connected to the base of the first transistor, the base of the second transistor, and the base of the third transistor, and
wherein a collector of the eleventh transistor is connected to an emitter of the twelfth transistor.

According to (11), the vertical connection configuration of the reference voltage circuit matches the vertical connection configuration of the constant current circuit and the current splitter circuit. Accordingly, in response to fluctuations in temperature or power supply voltage, movement of the voltages at the differential output nodes of the current splitter circuit (the differential input nodes of the differential transimpedance amplifier circuit) is matched with the movement of the reference voltage. As a result, compensation operations can be executed accurately with respect to the fluctuations in temperature or power supply voltage, and thereby, the fluctuation of the frequency characteristics when changing the gain can be more suppressed.

(12) Any one of (1) to (6) described above may further include:
a differential transimpedance amplifier configured to convert paired currents, which may be treated as a differential current, into paired voltages, which may be treated as a differential voltage; and
a differential amplifier circuit configured to amplify the paired voltages,
wherein the differential amplifier circuit includes the constant current circuit, the current splitter circuit, the DC voltage node, the load circuit, the differential transimpedance amplifier circuit, the voltage regulator circuit, and a differential pair circuit,
wherein the differential pair circuit includes a thirteenth transistor arranged at the first input node, a fourteenth transistor arranged at the second input node, and a resistor element connected between an emitter of the thirteenth transistor and an emitter of the fourteenth transistor, and
wherein a base of the thirteenth transistor and a base of the fourteenth transistor receive the paired voltages.

According to (12), in the differential amplifier circuit at the succeeding stage of the differential transimpedance amplifier, the difference in the respective average potentials described above is reduced. Accordingly, the deviation of the operating point of the differential transimpedance amplifier circuit from the optimum value is suppressed, and thereby, a receiver circuit that can suppress the fluctuation of the frequency characteristics when changing the gain can be provided.

(13) According to the present disclosure, an optical receiver circuit may include:
a first photodetector element configured to generate a first current signal according to a first optical signal;
a second photodetector element configured to generate a second current signal according to a second optical signal; and
The receiver circuit as described in any of (1) to (12) described above.

According to (13), the receiver circuit described in any one of (1) to (12) is provided, and thereby, an optical receiver circuit that can suppress the fluctuation of the frequency characteristics when changing the gain can be provided.

Details of Embodiments in Present Disclosure

Specific examples of receiver circuits and optical receiver circuits in the present disclosure will be described below with reference to the drawings. Note that the present invention is not limited to these exemplifications, and it is intended to cover matters implied by the claims and all changes within the meaning and scope of the claims and equivalence.

FIG. 1 is a diagram illustrating an example of a configuration of an optical receiver circuit according to an embodiment. An optical receiver circuit 200 illustrated in FIG. 1 generates paired voltage signals voutp and voutn according to a first optical signal Lp and a second optical signal Ln. The pair of first optical signal Lp and second optical signal Ln are optical signals having phases inverted from each other; for example, the first optical signal Lp is the positive-phase component of the differential light signal, and the second optical signal Ln is the reversed-phase component of the differential light signal. For example, as the intensity of the first optical signal Lp becomes greater, the intensity of the second optical signal Ln becomes smaller, and as the intensity of the first optical signal Lp becomes smaller, the intensity of the second optical signal Ln becomes greater. In addition, when the intensity of the first optical signal Lp reaches a maximum value (peak value), the intensity of the second optical signal Ln reaches a minimum value (bottom value), and when the intensity of the first optical signal Lp reaches a bottom value, the intensity of the second optical signal Ln reaches a peak value. It is favorable that the second optical signal Ln has a maximum amplitude whose magnitude is equivalent to the maximum amplitude of the first optical signal Lp, and has an average value whose magnitude is equivalent to the time average (average value) of the first optical signal Lp. In this way, the first optical signal Lp and the second optical signal Ln form a pair of complementary signals. The pair of complementary signals may be treated as a differential signal which has an intensity equivalent to at least a difference between the intensities of the complementary signals. For example, when the intensity of the first optical signal Lp has the peak value and the intensity of the second optical signal Ln has the bottom value, the differential signal may be configured to have a binary data "1". Reversely, when the intensity of the first optical signal Lp has the bottom value and the intensity of the second optical signal Ln has the peak value, the differential signal may be configured to have a binary data "0". Thus, the differential signal is transmitted using the pair of the complementary signals.

In the following description, in the case of a differential signal transmitted using a positive-phase component and a reverse-phase component, the positive-phase component and the reversed-phase component have substantially the same characteristics as the first optical signal Lp and the second optical signal Ln described above, respectively. For example, the paired voltage signals voutp and voutn may be treated as a differential voltage signal, which includes the voltage signal voutp as the positive-phase component and the voltage signal voutn as the reversed-phase component and has an amplitude equivalent to at least a difference between the voltage signal Voutp and the voltage signal Voutn. The differential voltage signal is transmitted using the paired voltage signals voutp and voutn.

The optical receiver circuit 200 is installed, for example, on a receiver of a digital coherent optical transmission scheme. The optical receiver circuit 200 includes a first photodetector element PDP, a second photodetector element PDN, and a receiver circuit 100. The first photodetector element PDP generates and outputs a first current signal ipdp according to the first optical signal Lp. The second photodetector element PDN generates and outputs a second current signal ipdn according to the second optical signal Ln.

The first photodetector element PDP and the second photodetector element PDN are, for example, a pair of photodetector elements. It is favorable that the second photodetector element PDN has, for example, the same electric and optical characteristics as the electric and optical characteristics of the first photodetector element PDP. For example, the first photodetector element PDP may be formed of the same material as the second photodetector element PDN so as to have the same structure.

The first photodetector element PDP receives the first optical signal Lp, and generates a first current signal ipdp. The first photodetector element PDP receives the first optical signal Lp, and outputs the first current signal ipdp whose current value is greater as the signal intensity of the received first optical signal Lp is greater. In addition, the first photodetector element PDP outputs the first current signal ipdp whose current value is smaller as the signal intensity of the received first optical signal Lp is smaller. The first photodetector element PDP outputs the first current signal ipdp whose current amplitude changes according to change in amplitude of the signal intensity of the first optical signal Lp. The first photodetector element PDP is, for example, a photodiode. The first photodetector element PDP has a cathode to which a bias voltage Vpd is applied, and an anode connected to a first input terminal INP of the receiver circuit 100. The first photodetector element PDP may be, for example, a photodetector element other than a photodiode. For example, in the case where the first photodetector element PDP is a photodiode, it is used in a reverse bias state so as to make the anode voltage lower than the cathode voltage.

The second photodetector element PDN receives the second optical signal Ln, and generates a second current signal ipdn. The second photodetector element PDN receives the second optical signal Ln, and outputs the second current signal ipdn whose current value is greater as the signal intensity of the received second optical signal Ln is greater. In addition, the second photodetector element PDN outputs the second current signal ipdn whose current value is smaller as the signal intensity of the received second optical signal Ln is smaller. The second photodetector element PDN outputs the second current signal ipdn whose current amplitude changes according to change in amplitude of the signal intensity of the second optical signal Ln. The second photodetector element PDN is, for example, a photodiode. The second photodetector element PDN has a cathode to which a bias voltage Vpd is applied, and an anode connected to a second input terminal INN of the receiver circuit 100. The second photodetector element PDN may be, for example, a photodetector element other than a photodiode. For example, in the case where the second photodetector element PDN is a photodiode, it is used in a reverse bias state so as to make the anode voltage lower than the cathode voltage.

The receiver circuit 100 generates the paired voltage signals voutp and voutn according to the first current signal ipdp and the second current signal ipdn. The paired voltage signals voutp and voutn are formed by the first voltage signal voutp and the second voltage signal voutn. For example, the first voltage signal voutp is the positive-phase component of the paired voltage signals voutp and voutn, and the second voltage signal voutn is the reversed-phase component of the paired voltage signals voutp and voutn. The paired voltage signals voutp and voutn may be treated as a differential voltage signal. For example, when the first optical signal Lp and the second optical signal Ln are a pair of complementary signals and their respective phases are inverted, the pair of first current signal ipdp and second current signal ipdn becomes a pair of complementary signals whose respective phases are inverted, and forms paired current signals. In other words, for example, the first current signal ipdp corresponds to the positive-phase component of the paired current signals, and the second current signal ipdn corresponds to the reversed-phase component of the paired current signals. The second current signal ipdn has a phase 180° different from the phase of the first current signal ipdp. The first current signal ipdp and the second current signal ipdn form paired input currents ipdp and ipdn. For example, when the value (current value) of the first current signal ipdp increases, the value of the second current signal ipdn decreases, and when the value of the first current signal ipdp decreases, the value of the second current signal ipdn increases. In addition, when the value of the first current signal ipdp reaches a maximum value (peak value), the value of the second current signal ipdn reaches a minimum value (bottom value), and when the value of the first current signal ipdp reaches a bottom value, the value of the second current signal ipdn reaches a peak value. It is favorable that the second current signal ipdn has a maximum amplitude whose magnitude is equivalent to the maximum amplitude of the first current signal ipdp, and has an average value whose magnitude is equivalent to the time average (average value) of the first current signal ipdp. In this way, the first current signal ipdp and the second current signal ipdn form a pair of complementary signals. The pair of complementary signals may be treated as a differential current signal.

The receiver circuit 100 includes the first input terminal INP to which the first photodetector element PDP is connected, and the second input terminal INN to which second photodetector element PDN is connected.

The first input terminal INP is electrically connected to, for example, the first photodetector element PDP outside the receiver circuit 100. The first input terminal INP receives the first current signal ipdp, for example, from the first photodetector element PDP. For example, in the case where the receiver circuit 100 is formed on a semiconductor chip as an integrated circuit, the first input terminal INP is a pad of the integrated circuit. For example, the first input terminal INP is electrically connected to the anode of the first photodetector element PDP via a bonding wire.

The second input terminal INN is electrically connected to, for example, the second photodetector element PDN outside the receiver circuit 100. The second input terminal INN receives the second current signal ipdn, for example, from the second photodetector element PDN. For example, in the case where the receiver circuit 100 is formed on a semiconductor chip as an integrated circuit, the second input terminal INN is a pad of the integrated circuit. For example, the second input terminal INN is electrically connected to the anode of the second photodetector element PDN via a bonding wire.

Figure 2:
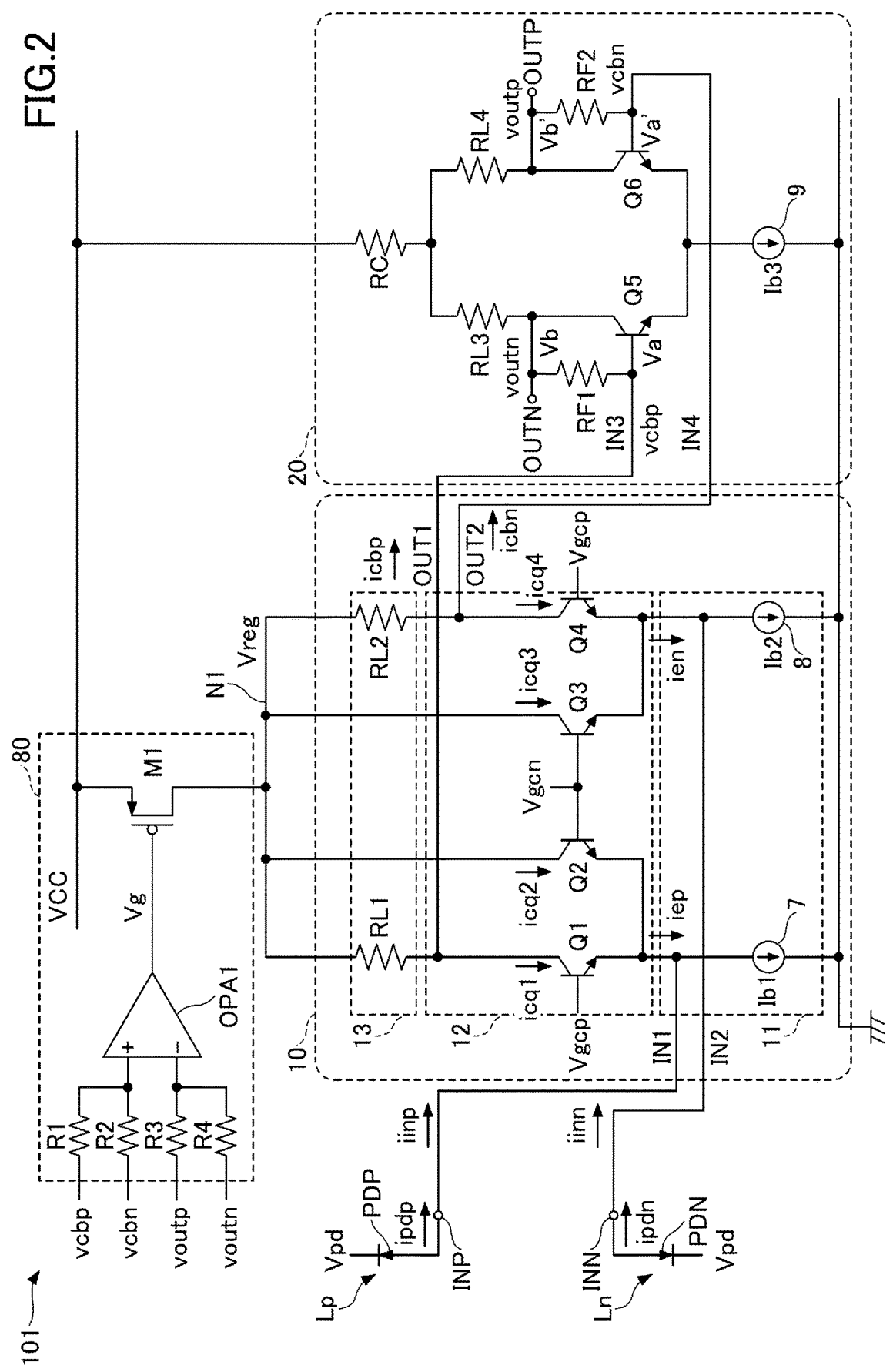
FIG. 2 is a diagram illustrating an example of a configuration of a receiver circuit according to a first embodiment.

FIG. 2 is a diagram illustrating an example of a configuration of a receiver circuit according to a first embodiment. A receiver circuit 101 illustrated in FIG. 2 is an example of the receiver circuit 100 (FIG. 1). The receiver circuit 101 includes a differential amplitude adjuster circuit 10 and a differential TIA circuit 20. TIA is an abbreviation for transimpedance amplifier.

In the receiver circuit 101, the first current signal ipdp is input through the first input terminal INP, and the second current signal ipdn is input through the second input terminal INN. The first current signal ipdp and the second current signal ipdn are input as first paired current signals iinp and iinn. The first current signal ipdp is input as the first input current iinp being the positive-phase component of the first paired current signals iinp and iinn, and the second current signal ipdn is input as the second input current iinn being the reversed-phase component of the first paired current signals iinp and iinn. The first current signal ipdp includes an alternate current component that changes with time for information transmission, and a direct current component (DC component) corresponding to a time-averaged value. The first input current iinp corresponds to the AC component of the first current signal ipdp. In addition, the second current signal ipdn includes an alternate current component that changes with time for information transmission and a DC component corresponding to a time-averaged value. The second input current iinn corresponds to the AC component of the second current signal ipdn. The respective DC components of the first current signal ipdp and the second current signal ipdn will be described later.

Note that in the specific name of a current signal, the leading capital letter I indicates a DC (direct current) current, and the leading lower-case letter i indicates a signal current including an AC (alternate current) component. In either case of a current signal including only the AC component, or case of including an AC component and a DC component, the beginning of the specific name is denoted by the lower-case letter i. In addition, in the specific name of a signal, the leading capital V indicates a DC voltage, and the leading lower-case letter v indicates a signal voltage including an AC component. In either case of a voltage signal including only the AC component, or case of including an AC component and a DC component, the beginning of the specific name is denoted by the lower-case letter v.

The first input current iinp and the second input current iinn as the AC components are input into the differential amplitude adjuster circuit 10.

The differential amplitude adjuster circuit 10 includes a constant current circuit 11, a current splitter circuit 12, and a load circuit 13. The current splitter circuit 12 is connected to the upper stage of the constant current circuit 11, and the load circuit 13 is connected to the upper stage of the current splitter circuit 12. The differential amplitude adjuster circuit 10 variably changes the current gain from 0 to 1 according to the first control voltage Vgcp and the second control voltage Vgcn. The current gain corresponds to a ratio of the magnitudes (amplitudes) of the third paired current signals icbp and icbn to the magnitudes (amplitudes) of the first paired current signals iinp and iinn. The first input current iinp is input into a first input node IN1 of the constant current circuit 11, and the second input current iinn is input into a second input node IN2 of the constant current circuit 11. The first input node IN1 is connected to the first input terminal INP. The second input node IN2 is connected to the second input terminal INN.

The constant current circuit 11 includes the first input node IN1 and the second input node IN2 to which the first paired current signals iinp and iinn are input, a first current source 7 connected to the first input node IN1, and a second current source 8 connected to the second input node IN2. The first current source 7 is connected between the first input node IN1 and ground, and supplies a first constant current Ib1. The second current source 8 is connected between the second input node IN2 and ground, and supplies a second constant current Ib2. The second constant current Ib2 has a current value that is equivalent to the current value of the first constant current Ib1.

The constant current circuit 11 generates second paired current signals iep and ien according to the first paired current signals iinp and iinn. The second paired current signals iep and ien may be treated as a second differential current signal. The current iep as the positive-phase component of the second paired current signals iep and ien is generated by the constant current circuit 11 subtracting the first input current iinp from the first constant current Ib1. The sum of the first input current iinp and the current iep is equivalent to the first constant current Ib1, and hence, for example, as the first input current iinp becomes greater, the current iep becomes smaller, and as the first input current iinp becomes smaller, the current iep becomes greater. In other words, the current iep is an inverted signal of the first input current iinp. The current ien as the reversed-phase component of the second paired current signals iep and ien is generated by the constant current circuit 11 subtracting the second input current iinn from the second constant current Ib2. The sum of the second input current iinn and the current ien is equivalent to the second constant current Ib2, and hence, for example, as the second input current iinn becomes greater, the current ien becomes smaller, and as the second input current iinn becomes smaller, the current ien becomes greater. In other words, the current ien is an inverted signal of the second input current iinn. Therefore, the current iep as the positive-phase component and the current ien as the reversed-phase component of the second paired current signals iep and ien are inverted for the positive-phase component iinp and the reversed-phase component iinn of the first paired current signals iinp and iinn, respectively, and hence, the second paired current signals iep and ien are inverted signals of the first paired current signals iinp and iinn.

The current splitter circuit 12 generates the third paired current signals icbp and icbn from the second paired current signals iep and ien. The third paired current signals icbp and icbn may be treated as a third differential current signal. The current splitter circuit 12 includes a first output node OUT1, a second output node OUT2, and transistors Q1, Q2, Q3, and Q4. The third paired current signals icbp and icbn are output from the first output node OUT1 and the second output node OUT2, respectively. The transistor Q1 is connected between the first input node IN1 and the first output node OUT1. The transistor Q2 is connected between the first input node IN1 and a DC voltage node N1 that will be described later. The transistor Q3 is connected between the second input node IN2 and the DC voltage node N1. The transistor Q4 is connected between the second input node IN2 and the second output node OUT2. It is favorable that the transistors Q1, Q2, Q3, and Q4 have the same electric characteristics as each another.

The current splitter circuit 12 is an example of a circuit that sets the amplitudes of the third paired current signals icbp and icbn to be smaller than the amplitudes of the second paired current signals iep and ien according to the first control voltage Vgcp and the second control voltage Vgcn. The current gain of the differential amplitude adjuster circuit 10 becomes less than or equal to 1 by the current splitter circuit 12, and thereby, the amplitudes of the third paired current signals icbp and icbn becomes equal to or smaller than the amplitudes of the first paired current signals iinp and iinn. Therefore, the differential amplitude adjuster circuit 10 attenuates the first paired current signals iinp and iinn, and outputs the attenuated paired current signals as the third paired current signals icbp and icbn.

The current splitter circuit 12 splits the current iep as the positive-phase component of the second paired current signals iep and ien, into two positive-phase-side collector currents (a first split current icq1 output from the collector of the transistor Q1 and a second split current icq2 output from the collector of the transistor Q2). The current splitter circuit 12 splits the current iep as the reversed-phase component of the second paired current signals ien and ien, into two reversed-phase-side collector currents (a third split current icq3 output from the collector of the transistor Q3 and a fourth split current icq4 output from the collector of the transistor Q4).

In the transistor Q1, the first control voltage Vgcp is applied to the base, the emitter is connected to the first input node IN1, and the collector is connected to the first output node OUT1. In the transistor Q2, the second control voltage Vgcn is applied to the base, the emitter is connected to the first input node IN1, and the collector is connected to the DC voltage node N1. Accordingly, the current iep is split into the first split current icq1 and a second split current icq2 according to the first control voltage Vgcp and the second control voltage Vgcn. In the transistor Q3, the second control voltage Vgcn is applied to the base, the emitter is connected to the second input node IN2, and the collector is connected to the DC voltage node N1. In the transistor Q4, the first control voltage Vgcp is applied to the base, the emitter is connected to the second input node IN2, and the collector is connected to the second output node OUT2. Accordingly, the current ien is split into the third split current icq3 and the fourth split current icq4 according to the first control voltage Vgcp and the second control voltage Vgcn.

The load circuit 13 includes a first load resistor element RL1 and a second load resistor element RL2. The first load resistor element RL1 is connected to the first output node OUT1, for example, between the DC voltage node N1 and the first output node OUT1 (the collector of the transistor Q1). The second load resistor element RL2 is connected to the second output node OUT2, for example, between the DC voltage node N1 and the second output node OUT2 (the collector of the transistor Q4). The second load resistor element RL2 has a resistance value, for example, that is equivalent to the resistance value of the first load resistor element RL1.

The current splitter circuit 12 subtracts the first split current icq1 from a current flowing through the first load resistor element RL1, to output, from the first output node OUT1, the positive-phase output current icbp as the positive-phase component of the third paired current signals icbp and icbn. The current splitter circuit 12 subtracts the fourth split current icq4 from a current flowing through the second load resistor element RL2, to output, from the second output node OUT2, the reversed-phase output current icbp as the reversed-phase component of the third paired current signals icbn and icbn.

The current splitter circuit 12 changes the ratio of the two positive-phase-side collector currents (the first split current icq1 and the second split current icq2) and the ratio of the two reversed-phase-side collector currents (the third split current icq3 and the fourth split current icq4) according to the first control voltage Vgcp and the second control voltage Vgcn. As described above, the positive-phase output current icbp as the positive-phase component of the third paired current signals icbp and icbn is generated according to the first split current icq1, and the reversed-phase output current icbn as the reversed-phase component of the third paired current signals icbp and icbn is generated according to the fourth split current icq4. The current splitter circuit 12 changes the amplitude of the positive-phase output current icbp by changing the amplitude of the first split current icq1, and changes the amplitude of the reversed-phase output current icbn by changing the amplitude of the fourth split current icq4. The first control voltage Vgcp is an example of a first control signal. The second control voltage Vgcn is an example of a second control signal. Note that the second split current icq2 and the third split current icq3 do not contribute to generation of the third paired current signals icbp and icbn.

The first control voltage Vgcp may be set to a value, for example, around which the transistor Q1 and the transistor Q4 are not saturated. The second control voltage Vgcn may be set to a value, for example, around which the transistor Q2 and the transistor Q3 are not saturated. In order to reduce the current gain of the differential amplitude adjuster circuit 10, by decreasing the first control voltage Vgcp and increasing the second control voltage Vgcn, the second split current icq2 and the third split current icq3 may be increased, and the first split current icq1 and the fourth split current icq4 may be decreased. In order to increase the current gain of the differential amplitude adjuster circuit 10, by increasing the first control voltage Vgcp and decreasing the second control voltage Vgcn, the second split current icq2 and the third split current icq3 may be decreased, and the first split current icq1 and the fourth split current icq4 may be increased.

Note that to be precise, the magnitudes of the respective currents from the first split current icq1 to the fourth split current icq4 are set according to the voltage difference between the first control voltage Vgcp and the second control voltage Vgcn. For example, if ¾ of the current iep is split into the first split current icq1; the remaining ¼ of the current iep is split into the second split current icq2; ¾ of the current ien is split into the fourth split current icq4; and the remaining ¼ of the current ien is split into the third split current icq3, then, the amplitudes of the third paired current signals icbp and icbn are ¾ of the amplitudes of the second paired current signals iep and ien. For example, if ½ of the current iep is split into the first split current icq1; the remaining ½ of the current iep is split into the second split current icq2; ½ of the current ien is split into the fourth split current icq4; and the remaining ½ of the current ien is split into the third split current icq3, then, the amplitudes of the third paired current signals icbp and icbn are ½ of the amplitudes of the second paired current signals iep and ien. Note that the third paired current signals icbp and icbn are inverted signals of the second paired current signals iep and ien, respectively.

In this way, the differential amplitude adjuster circuit 10 variably changes the current gain according to the first control voltage Vgcp and the second control voltage Vgcn input into the current splitter circuit 12. The current gain corresponds to a ratio of the magnitudes (amplitudes) of the third paired current signals icbp and icbn to the magnitudes (amplitudes) of the first paired current signals iinp and iinn. The current gain is obtained by, for example, a formula (icbp–icbn)/(iinp–iinn). In the case where the current gain is variably changed by the differential amplitude adjuster circuit 10 having such a configuration, the change in the input impedance (as observed from the first input terminal INP and the second input terminal INN) caused by the change in the current gain is small, and hence, the change in the frequency characteristics of the current gain is suppressed.

In the differential amplitude adjuster circuit 10, the second paired current signals iep and ien are output from the constant current circuit 11 according to the first paired current signals iinp and iinn. Among the second paired current signals iep and ien, the split currents icq1 and icq4 flowing through the transistors Q1 and Q4 are input into the load resistor elements RL1 and RL2 and the next stage.

In the present embodiment, a differential TIA circuit 20 that includes a differential amplifier, a first feedback resistor element RF1, and a second feedback resistor element RF2 is connected to the next stage of the differential amplitude adjuster circuit 10 (the current splitter circuit 12). The differential TIA circuit 20 has an input impedance that is set lower than the resistance values of the load resistor elements RL1 and RL2. Therefore, among the second paired current signals iep and ien, most of the split current icq1 and icq4 flowing through the transistors Q1 and Q4 are input into the differential TIA circuit 20.

On the other hand, in the differential amplitude adjuster circuit 10, the split currents icq2 and icq3 flowing through the transistors Q2 and Q3 are not output from the first output node OUT1 and the second output node OUT2, to become reactive currents (consumed as reactive power). The magnitude of the positive-phase output current icbp varies according to the first control voltage Vgcp and the second control voltage Vgcn. The sign of the positive-phase output current icbp is always non-inverted with respect to the sign of the first input current iinp. Similarly, the magnitude of the reversed-phase output current icbn varies according to the first control voltage Vgcp and the second control voltage Vgcn. The sign of the reversed-phase output current icbn is always non-inverted with respect to the sign of the second input current iinn. Therefore, when the first input current iinp is positive, the positive-phase output current icbp is positive, and when the first input current iinp is negative, the positive-phase output current icbp is negative. Similarly, when the second input current iinn is positive, the reversed-phase output current icbn is positive, and when the second input current iinn is negative, the reversed-phase output current icbn is negative. Such an operation is also called a two-quadrant operation.

The input capacitance of the differential TIA circuit 20 is separated from the respective outputs of the first photodetector element PDP and the second photodetector element PDN by the differential amplitude adjuster circuit 10; therefore, by reducing the input capacitance of the differential amplitude adjuster circuit 10, the first photodetector element PDP and the second photodetector element PDN can operate in a wide band.

The differential TIA circuit 20 converts the amplitude-adjusted third paired current signals icbp and icbn into the paired voltage signals voutp and voutn. The paired voltage signals voutp and voutn may be treated as a differential voltage signal. The differential TIA circuit 20 includes a third input node IN3 and a fourth input node IN4 to which the third paired current signals icbp and icbn are input, and a first output terminal OUTP and a second output terminal OUTN that output paired voltage signals voutp and voutn. The third input node IN3 is connected to the first output node OUT1, and the fourth input node IN4 is connected to the second output node OUT2.

The differential TIA circuit 20 includes a transistor Q5 whose base is connected to the third input node IN3, and a transistor Q6 whose base is connected to the fourth input node IN4. The collector of the transistor Q5 is connected to the second output terminal OUTN, and the collector of the transistor Q6 is connected to the first output terminal OUTP. The emitter of the transistor Q5 and the emitter of the transistor Q5 are connected to each other and connected to the third current source 9. It is favorable that the transistors Q5 and Q6 have the same electric characteristics as each other.

The differential TIA circuit 20 includes a first feedback resistor element RF1 connected between a third input node IN3 and the second output terminal OUTN, and a second feedback resistor element RF2 connected between a fourth input node IN4 and the first output terminal OUTP. The first feedback resistor element RF1 is connected between the base and the collector of the transistor Q5. The second feedback resistor element RF2 is connected between the base and the collector of the transistor Q6. By having such a circuit configuration, the differential TIA circuit 20 generates the paired voltage signals voutp and voutn according to the third paired current signals icbp and icbn.

It is required that, in a circuit in which the differential TIA circuit 20 is connected to the differential amplitude adjuster circuit 10, the respective voltage values of node voltages Va and Vb at both ends of the first feedback resistor element RF1 and node voltages Va' and Vb' at both ends of the second feedback resistor element RF2 are set to be equivalent to each other. Note that the node voltages Va, Vb, Va', and Vb' represent the average voltages (DC voltages) of the third input node IN3, the second output terminal OUTN, the fourth input node IN4, and the first output terminal OUTP, respectively. For example, in the case where the node voltages Va and Vb are different, a current flows through the first feedback resistor element RF1, the operating point of the differential TIA circuit 20 deviates from the optimum value, and the frequency characteristics may be deteriorated. In addition, the deviation between the node voltages Va and Va' corresponds to the input offset of the differential amplifier circuit; therefore, the linear operation range of the differential TIA circuit 20 is narrowed.

Therefore, the receiver circuit 101 according to the present embodiment includes a voltage regulator circuit 80 configured to adjust the gate voltage of a transistor M1 so as to reduce the difference in the respective average displacements of the first output node OUT1, the second output node OUT2, the first output terminal OUTP, and the second output terminal OUTN. Accordingly, the deviation of the operating point of the differential TIA circuit 20 from the optimum value is suppressed, and thereby, the receiver circuit 100 and the optical receiver circuit 200 that can suppress the fluctuation of frequency characteristics when changing the current gain can be provided. Each average displacement refers to a value obtained by averaging the instantaneous value of the voltage of each node or terminal over a predetermined time (e.g., a time between one period to a few milliseconds). Note that here, the ground potential is considered as the reference potential; therefore, the average potential may be considered as the average voltage.

The voltage regulator circuit 80 generates a DC voltage Vreg from the power supply voltage Vcc supplied by the power supply wire VCC. The voltage regulator circuit 80 includes, for example, a resistor element R1 to a resistor element R4, an operational amplifier OPA1, and the transistor M1.

The resistor element R1 is an example of a first input resistor element. The resistor element R1 is connected between the collector of the transistor Q1 and the non-inverted input terminal of the operational amplifier OPA1. The resistor element R2 is an example of a second input resistor element. The resistor element R2 is connected between the collector of the transistor Q4 and the non-inverted input terminal of the operational amplifier OPA1. The resistor element R3 is an example of a third input resistor element. The resistor element R3 is connected between the collector of the transistor Q6 and the inverted input terminal of the operational amplifier OPA1. The resistor element R4 is an example of a fourth input resistor element. The resistor element R4 is connected between the collector of the transistor Q5 and the inverted input terminal of the operational amplifier OPA1.

The transistor M1 is a field effect transistor (FET), for example, a P-channel type MOSFET. The transistor M1 is connected between the power supply wire VCC and the DC voltage node N1. The transistor M1 has the gate connected to the output of the operational amplifier OPA1, the source connected to the power supply wire VCC, and the drain connected to the DC voltage node N1. The DC voltage node N1 has a potential lower than the voltage Vcc of the power supply wire VCC. The DC voltage Vreg of the DC voltage node N1 is lower than the power supply voltage Vcc supplied by the power supply wire VCC.

The differential amplitude adjuster circuit 10 is connected to the power supply wire VCC via the transistor M1. The transistor M1 generates the DC voltage Vreg and supplies it to the differential amplitude adjuster circuit 10. The differential amplitude adjuster circuit 10 operates using the DC voltage Vreg as a power supply voltage.

The voltage regulator circuit 80 monitors the input voltages vcbp and vcbn and the output voltages voutp and voutn. The input voltages vcbp and vcbn correspond to the paired voltage signals input into the third input node IN3 and the fourth input node IN4 of the differential TIA circuit 20, or the paired voltage signals output from the first output node OUT1 and the second output node OUT2 of the differential amplitude adjuster circuit 10. The output voltages voutp and voutn correspond to the paired voltage signals output from the first output terminal OUTP and the second output terminal OUTN of the differential TIA circuit 20.

The voltage regulator circuit 80 amplifies, by the operational amplifier OPA1, the difference between the average values of the input voltages vcbp and vcbn monitored by the resistor elements R1 and R2 and the average values of the output voltages voutp and voutn monitored by the resistor elements R3 and R4. The voltage regulator circuit 80 controls the gate of the transistor M1 according to the amplified output of the difference by the operational amplifier OPA1. Accordingly, the voltage regulator circuit 80 can execute feedback control of the DC voltage Vreg so as to make the average values of the input voltages vcbp and vcbn coincide with the average values of the output voltages voutp and voutn (To prevent DC current from flowing to first feedback resistor element RF1 and second feedback resistor element RF2). By such feedback control, the DC voltage between the collector and the base of each of the transistors Q1, Q4 and Q5, Q6 is stabilized, and the fluctuation of the frequency characteristics of the current gain can be suppressed.

The operating point of the differential amplitude adjuster circuit 10 in a two quadrant operation changes with the change in the current gain obtained by the above-described operations of the current splitter circuit 12. Therefore, the DC voltages of the input voltages vcbp and vcbn also change with the change in the current gain. By the voltage regulator circuit 80 executing feedback control, the operating point of the differential amplitude adjuster circuit 10 is stabilized against the change in the current gain.

In the differential TIA circuit 20, in the case where the average values of the input voltages vcbp and vcbn are greater (higher) than the average values of the output voltages voutp and voutn, the output voltage of the operational amplifier OPA1 becomes higher. In this case, the voltage Vgs between the gate and the source of the transistor M1 becomes lower, and the resistance value Rds between the source and the drain of the transistor M1 becomes greater. Accordingly, as the voltage drop between the source and the drain of the transistor M1 becomes greater, the DC voltage Vreg becomes lower, and the average values (i.e., the average values of the paired voltage signals output from the differential amplitude adjuster circuit 10) of the input voltages vcbp and vcbn become smaller. Consequently, the average values of the node voltage Va and the node voltage Va' approach the average values of the node voltage Vb and the node voltage Vb'.

On the other hand, in the differential TIA circuit 20, in the case where the average values of the input voltages vcbp and vcbn are smaller (lower) than the average values of the output voltages voutp and voutn, the output voltage of the operational amplifier OPA1 becomes lower. In this case, the voltage Vgs between the gate and the source of the transistor M1 becomes higher, and the resistance value Rds between the source and the drain of the transistor M1 becomes smaller. Accordingly, as the voltage drop between the source and the drain of the transistor M1 becomes smaller, the DC voltage Vreg becomes higher, and the average values (i.e., the average values of the paired voltage signals output from the differential amplitude adjuster circuit 10) of the input voltages vcbp and vcbn become greater. Consequently, the average value of the node voltage Va and the node voltage Va' approach the average value of the node voltage Vb and the node voltage Vb'.

The voltage regulator circuit 80 adjusts the DC voltage Vreg so as to make the average values of the input voltages vcbp and vcbn equivalent to the average values of the output voltages voutp and voutn by such a feedback operation. Consequently, the difference between the average value of the node voltage Va and the node voltage Va' and the average value of the node voltage Vb and the node voltage Vb' is suppressed. For example, an average value of the node Va, an average value of the node Va', an average value of the node Vb, and an average value of the node Vb' become the same with each other or different to each other within an acceptable error.

The differential TIA circuit 20 further includes a third current source 9, a third load resistor element RL3, and a fourth load resistor element RL4. The third current source 9 supplies a third constant current Ib3. The third current source 9 is connected between a common connection node at which the emitter of the transistor Q5 and the emitter of the transistor Q6 are connected to each other, and the ground wire. It is favorable that the fourth load resistor element RL4 has a resistance value equivalent to the resistance value of the third load resistor element RL3. One end of the third load resistor element RL3 is connected to the collector of the transistor Q5. One end of the fourth load resistor element RL4 is connected to the collector of the transistor Q6. The other end of the third load resistor element RL3 is connected to the other end of the fourth load resistor element RL4. The pair of transistors Q5 and Q6, the pair of load resistor elements RL3 and RL4, and the third current source 9 constitute the differential amplifier described above.

The third constant current Ib3 is set so as to be equivalent to the sum of the average current flowing through the third load resistor element RL3 and the average current flowing through the fourth load resistor element RL4. Accordingly, the deviation of the operating point of the differential TIA circuit 20 from the optimum value is further suppressed, and thereby, the fluctuation of the frequency characteristics when changing the current gain can be further suppressed. The average current is a value obtained by averaging the absolute value of the instantaneous value of the AC current over a predetermined period of time (e.g., a time between one period and a few milliseconds).

The differential TIA circuit 20 further includes a fifth load resistor element RC. The fifth load resistor element RC has its one end connected to the third load resistor element RL3 and the fourth load resistor element RL4, and has the other end connected to the power supply wire VCC. By the resistance value of the fifth load resistor element RC, the average current flowing through the third load resistor element RL3 and the average current flowing through the fourth load resistor element RL4 can be set to desired values.

In order to make the node voltages Va, Vb, Va', and Vb' equivalent to each other, the respective voltage drops caused by the load resistances (the first load resistor element RL1 to the fifth load resistor element RC) and the bias currents (the first constant current Ib1 to the third constant current Ib3) are made to be equivalent to each other. First, in order to make the node voltage Va and the node voltage Va' equivalent to each other, the values are set so as to satisfy $RL1 \times Ib1 = RL2 \times Ib2$, and in order to make the node voltage Vb and the node voltage Vb' equivalent to each other, the values are to satisfy $RL3 \times Ib3/2 = RL4 \times Ib3/2$. Further, the reference potential of the voltage of the first output node OUT1 and the second output node OUT2 of the differential amplitude adjuster circuit 10 is the DC voltage Vreg of the DC voltage node N1, and the reference potential of the voltage of the first output terminal OUTP and the second output terminal OUTN of the differential TIA circuit 20 is the power supply voltage Vcc. Therefore, the respective resistance values of the first load resistor element RL1 to the fifth load resistor element RC and the respective current values of the first constant current Ib1 to the third constant current Ib3 are set with respect to the DC voltage Vreg and the power supply voltage Vcc so as to satisfy $Vreg - RL1 \times Ib1 = Vreg - RL1 \times Ib2 = Vcc - (RC \times Ib3 + RL3 \times Ib3/2) = Vcc - (RC \times Ib3 + RL4 \times Ib3/2)$. In the above formula, RL1 represents the resistance value of the first load resistor element RL1, and RL2, RL3, RL4, and RC represent the resistance values of the load resistor elements RL2, RL3, RL4, and RC, respectively. In addition, in order to reduce the influence of fluctuations in temperature and power supply voltage, for example, it is favorable to provide a compensation function for environmental fluctuations in the first constant current Ib1, the second constant current Ib2, and the third constant current Ib3.

Figure 3:
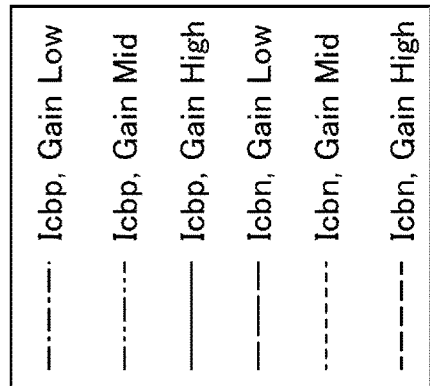
FIG. 3 is a diagram illustrating DC characteristics of a current splitter circuit 12 having transistors Q1 to Q4.
Figure 3:
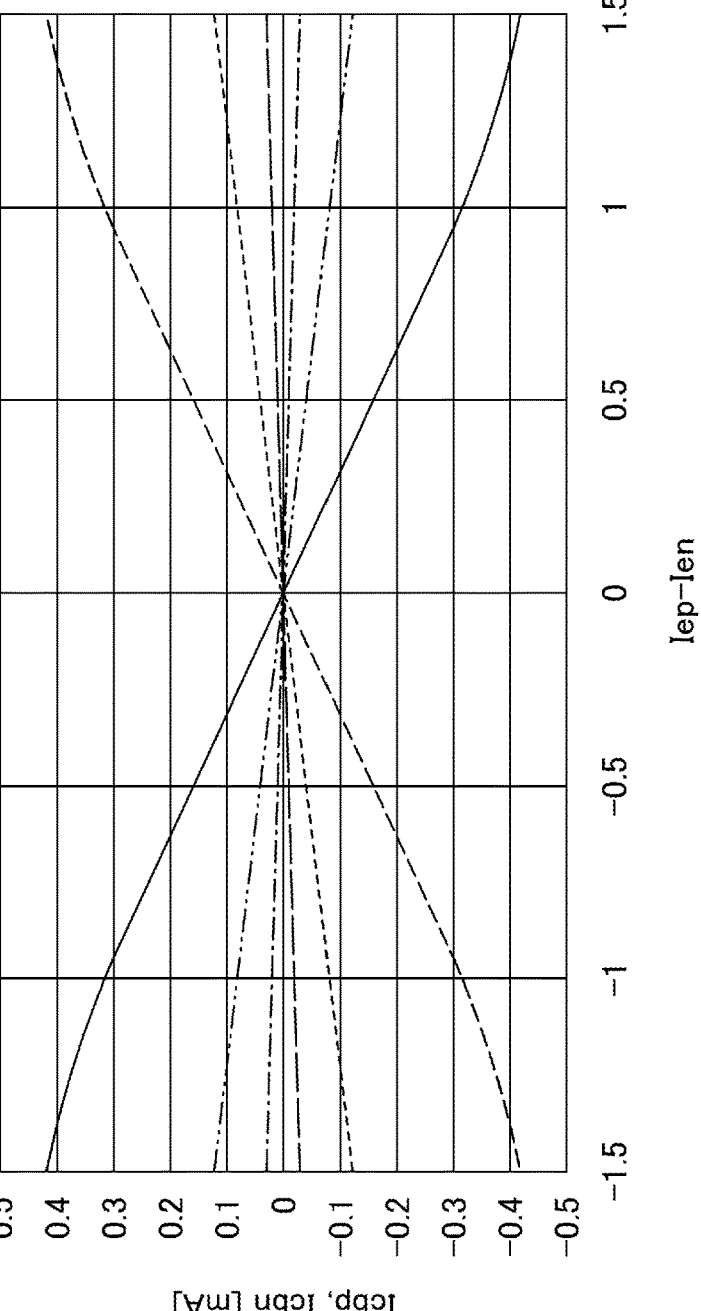

FIG. 3 is a diagram illustrating DC characteristics of the current splitter circuit 12 having the transistors Q1 to Q4. FIG. 3 illustrates results of a circuit simulation. The horizontal axis represents the difference of the input currents iep−ien. The vertical axis represents the positive-phase output current icbp or the reversed-phase output current icbn at levels of high gain (high), mid gain (mid), and low gain (low). Here, the second paired current signals iep and ien are complementary and ien=−iep. Note that Iep represents a current in the case where the positive-phase component iep of the second paired current signals iep and ien is DC, and Ien represents a current in the case where the reversed-phase component ien of the second paired current signals iep and ien is DC. In addition, each of the positive-phase output current Icbp and the reversed-phase output current Icbn also represents a DC current.

When the first control voltage Vgcp is relatively higher than the second control voltage Vgcn, the gain setting becomes high, and the difference Icbp−Icbn between the positive-phase output current icbp and the reversed-phase output current icbn in response to the change in the input current difference iep−ien is great, and the current gain becomes high. When the first control voltage Vgcp is relatively lower than the second control voltage Vgcn, the gain setting becomes low, and the difference Icbp−Icbn between positive-phase output current icbp and reversed-phase output current icbn in response to the change in the input current difference iep−ien is small, and the current gain becomes low. The gain setting mid is intermediate between high and low.

Note that as the first input current iinp increases, the current iep decreases. As the current iep decreases, the positive-phase output current icbp increases. Therefore, as the first input current iinp increases, the positive-phase output current icbp increases. Conversely, as the first input current iinp decreases, the positive-phase output current icbp decreases.

Similarly, as the second input current iinn increases, the current ien decreases. As the current ien decreases, the reversed-phase output current icbn increases. Therefore, as the second input current iinn increases, the reversed-phase output current icbn increases. Conversely, as the second input current iinn decreases, the reversed-phase output current icbn decreases.

In addition, as the input current difference iinp−iinn increases, the current difference iep−ien decreases. As the current difference iep−ien decreases, the output current difference icbp−icbn increases (see FIG. 3; although FIG. 3 illustrates DC characteristics, the AC component shows substantially the same trend of increase/decrease). Therefore, as the input current difference iinp−iinn increases, the output current difference icbp−icbn increases. Conversely, as the input current difference iinp−iinn decreases, the output current difference icbp−icbn decreases. Therefore, the third paired current signals icbp and icbn are non-inverted with respect to the first paired current signals iinp and iinn. In this way, the differential amplitude adjuster circuit 10 adjusts the amplitude of the differential signals without inversion. Note that, in general, the polarities of differential signals are inverted by exchanging the positive-phase and reversed-phase components with each other. For example, by exchanging the first output node OUT1 and the second output node OUT2 with each other, the differential amplitude adjuster circuit 10 can execute an inverted operation.

Figure 4:
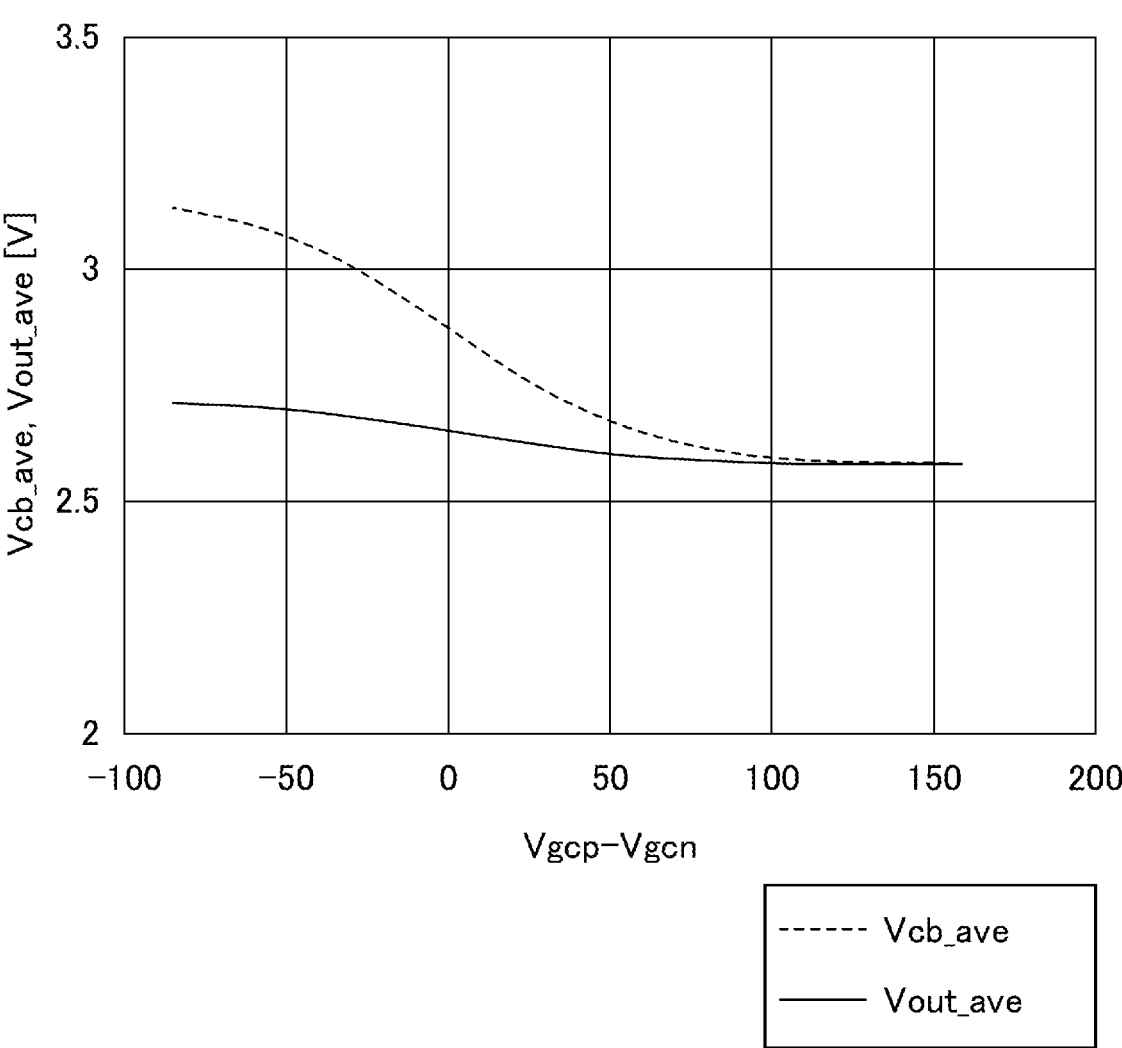
FIG. 4 is a characteristic diagram of a receiver circuit of one comparative form without a voltage regulator circuit.
Figure 5:
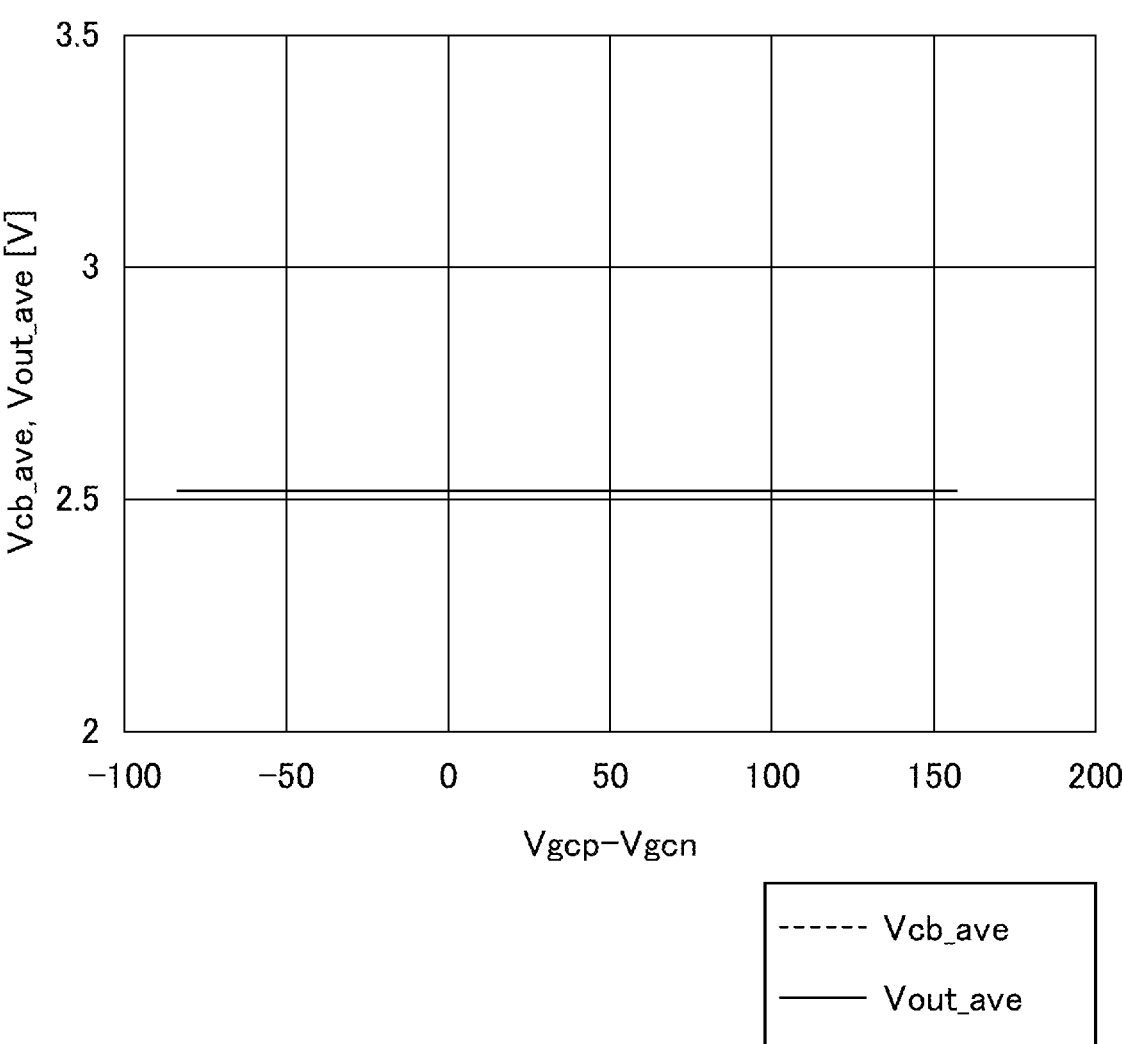
FIG. 5 is a characteristic diagram of a receiver circuit of the present embodiment that includes a voltage regulator circuit.

FIGS. 4 and 5 show relationships between the control voltage difference Vgcp−Vgcn between the first control voltage Vgcp and the second control voltage Vgcn, and the average values Vcb_ave of the input voltages vcbp and vcbn and the average values Vout_ave of the output voltages voutp and voutn. For comparison, FIG. 4 illustrates a characteristic diagram of a receiver circuit of one comparative form that does not include a voltage regulator circuit 80 (the differential amplitude adjuster circuit 10 is directly connected to the power supply wire VCC), and FIG. 5 illustrates a characteristic diagram of the receiver circuit 101 of the present embodiment that includes the voltage regulator circuit 80.

In FIG. 4, in a region where the control voltage difference Vgcp–Vgcn is relatively great (e.g., greater than or equal to 130 mV), the average value Vcb_ave of the input voltages vcbp and vcbn and the average value Vout_ave of the output voltages voutp and voutn are almost the same. On the other hand, in a region where the control voltage difference Vgcp–Vgcn is relatively small (e.g., less than or equal to 50 mV), the average value Vcb_ave of the input voltages vcbp and vcbn is higher than the average value Vout_ave of the output voltages voutp and voutn. The difference between the average values Vcb_ave and Vout_ave corresponds to the voltage difference between the first feedback resistor element RF1 and the second feedback resistor element RF2, and is the voltage between the base and the collector of each of the transistors Q5 and Q6. Therefore, the bias voltages of the transistors Q5 and Q6 varies significantly depending on the gain setting, and affects the frequency characteristics of the current gain.

On the other hand, in FIG. 5, regardless of the magnitude of the control voltage difference Vgcp–Vgcn, the average value Vcb_ave and the average value Vout_ave exhibit constant voltage values equivalent to each other. Therefore, the bias voltages of the transistors Q5 and Q6 are stabilized.

Figure 6:
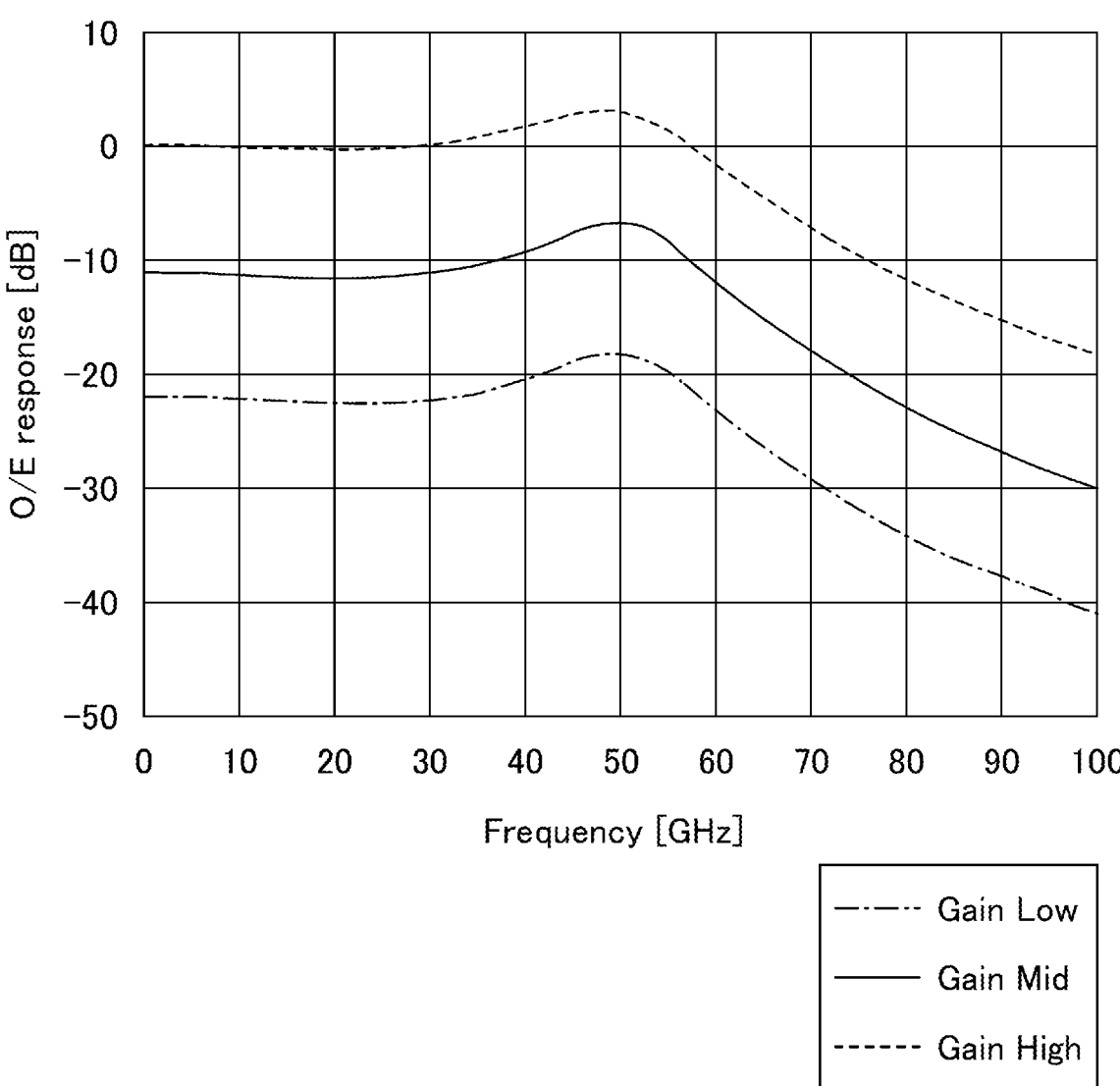
FIG. 6 is a diagram illustrating frequency characteristics of the O/E response of an optical receiver circuit.
Figure 7:
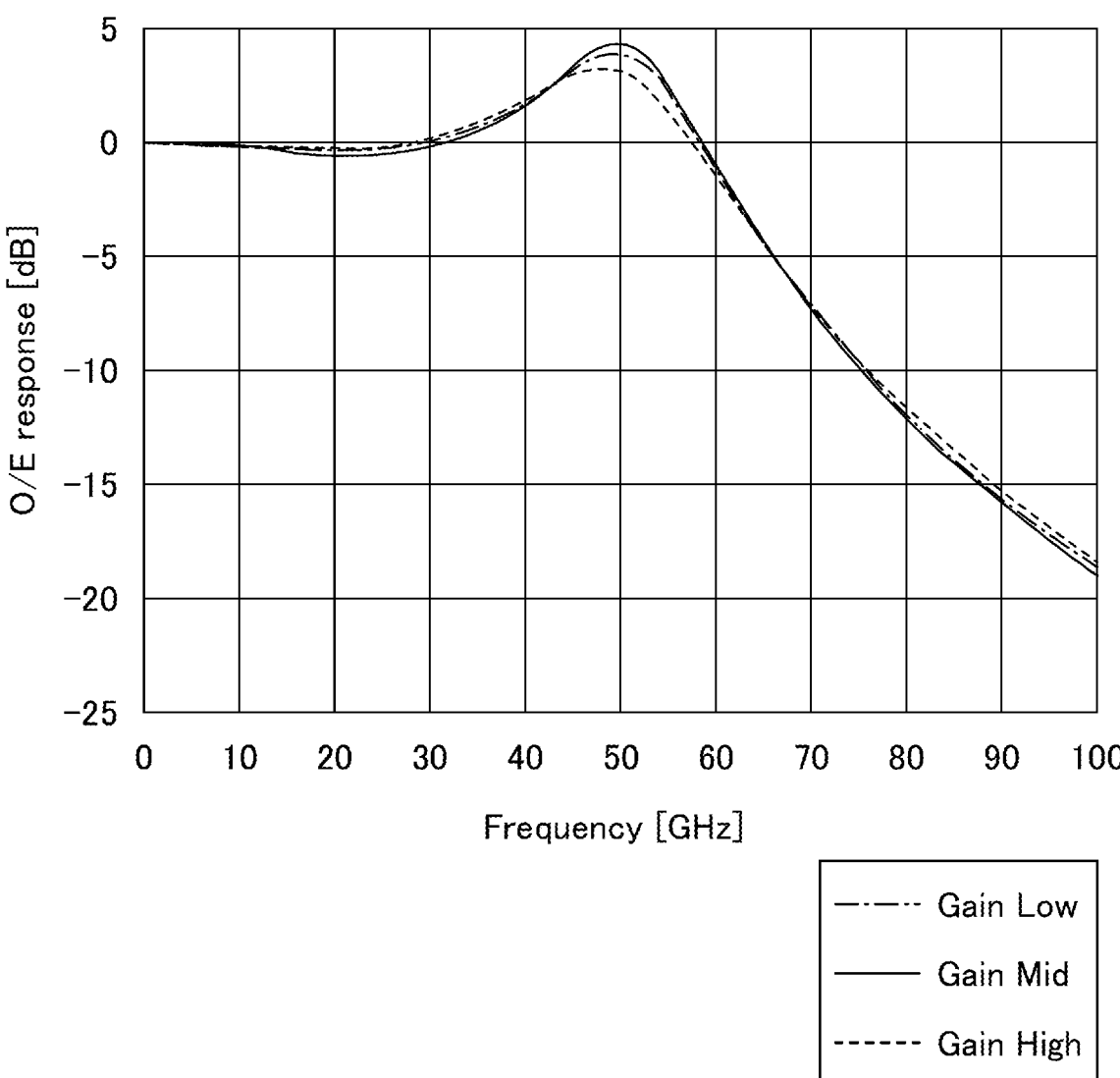
FIG. 7 is a diagram illustrating frequency characteristics of the O/E response of an optical receiver circuit.

FIGS. 6 and 7 illustrate frequency characteristics of the O/E response determined by a circuit simulation (O/E: Optical signal/Electrical signal). In FIGS. 6 and 7, the horizontal axis represents the frequencies of the complementary optical signals Lp and Ln. As described above, by adjusting the control voltage difference Vgcp–Vgcn, the current gain can be set to three levels of, for example, the high gain high, the medium gain mid, and the low gain low.

The vertical axis in FIG. 6 represents the value obtained by normalizing the gain of each level by a gain value at 1 GHz when the gain setting is high. According to FIG. 6, a variable width of greater than or equal to 20 dB is obtained between the gain when the gain setting is high and the gain when the gain setting is low. The vertical axis in FIG. 7 represents the value obtained by normalizing the gain of each level by a gain value at 1 GHz for each stage of the gain settings of high, mid, and low According to FIG. 7, it can be seen that the frequency characteristics of the gain settings of high, mid, and low almost overlap, and the effect of the change in gain is small. In other words, the fluctuation of the frequency characteristics when changing the current gain is further suppressed.

Figure 8:
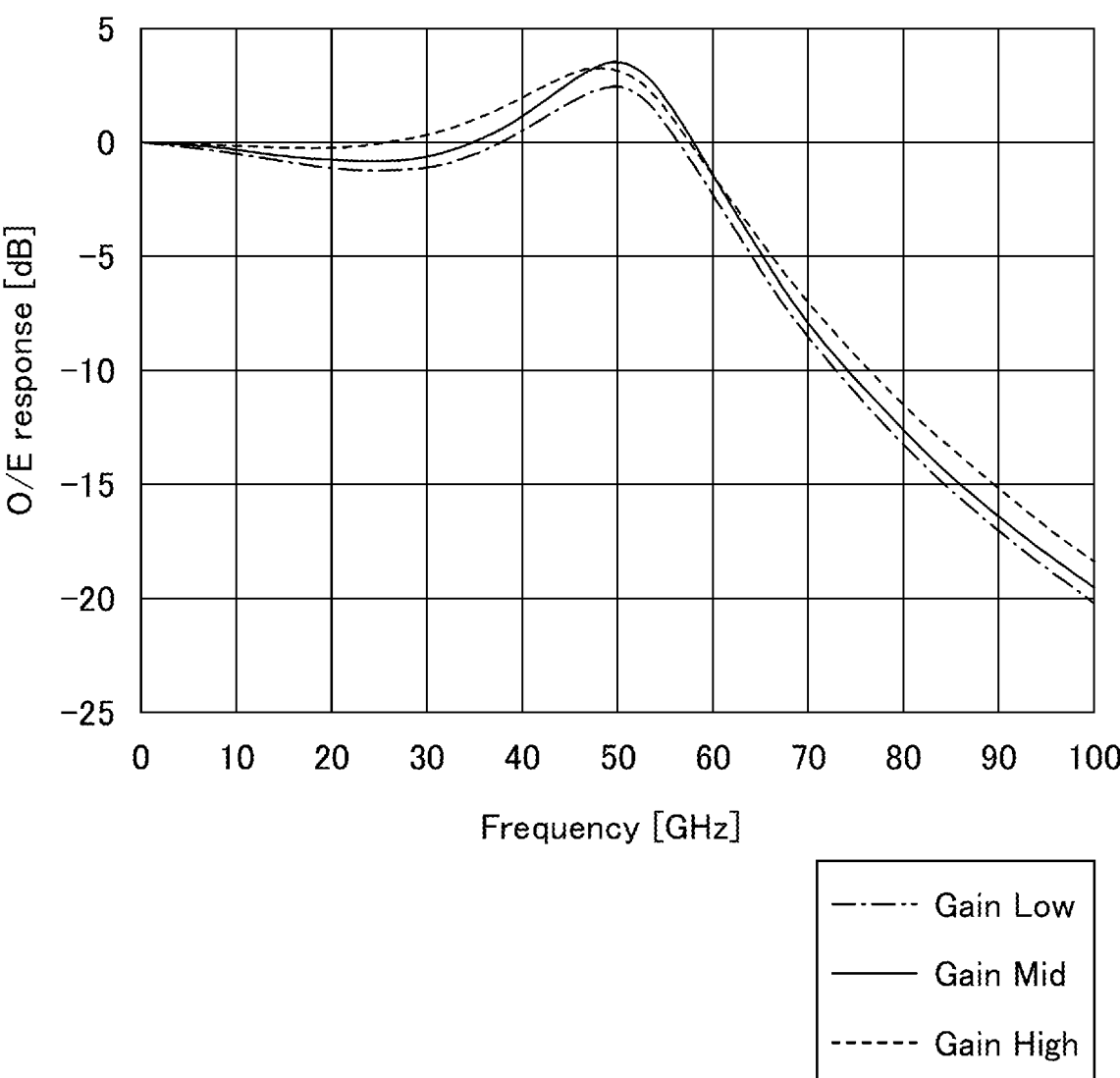
FIG. 8 is a diagram illustrating frequency characteristics of the O/E response of the optical receiver circuit of one comparative form without a voltage regulator circuit.

FIG. 8 is a diagram illustrating the O/E response obtained by a circuit simulation for the receiver circuit of the one comparative form that does not include a voltage regulator circuit 80 (the differential amplitude adjuster circuit 10 is directly connected to the power supply wire VCC). The vertical axis in FIG. 8 represents the value obtained by normalizing the gain of each level by a gain value at 1 GHz for each stage of the gain settings of high, mid, and low As the current flowing through the transistors Q1 and Q4 decreases by lowering the current gain, the voltage drop at the load resistor elements RL1 and RL2 decreases, and the average value of the input voltages vcbp and vcbn to the differential TIA circuit 20 increase. Accordingly, direct currents flow through the feedback resistor elements RF1 and RF2, the output voltages voutp and voutn decrease, and the voltage between the collector and the base of each of the transistors Q5 and Q6 decreases. As a result, as compared with FIG. 7, the fractionation of the frequency characteristics of the O/E response increases due to the change in the current gain.

Figure 9:
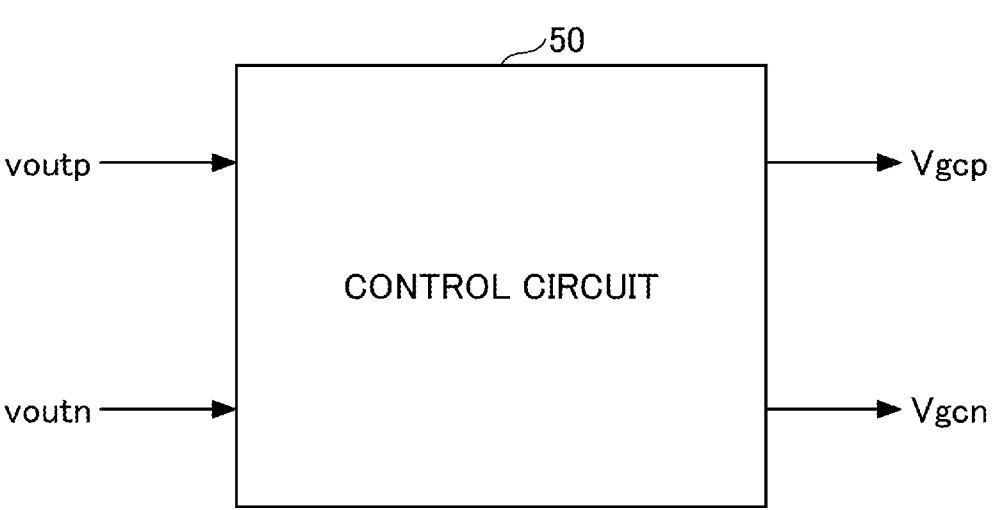
FIG. 9 is a diagram illustrating a control circuit that controls the gain of a differential amplitude adjuster circuit 10.

FIG. 9 is a diagram illustrating a control circuit that controls the gain of the differential amplitude adjuster circuit 10. The control circuit 50 detects, for example, the amplitudes of the paired voltage signals voutp and voutn, and according to the detection results, generates the first control voltage Vgcp and the second control voltage Vgcn. The control circuit 50 may be a circuit provided inside the receiver circuit 100, or may be a circuit provided outside the receiver circuit 100.

Figure 10:
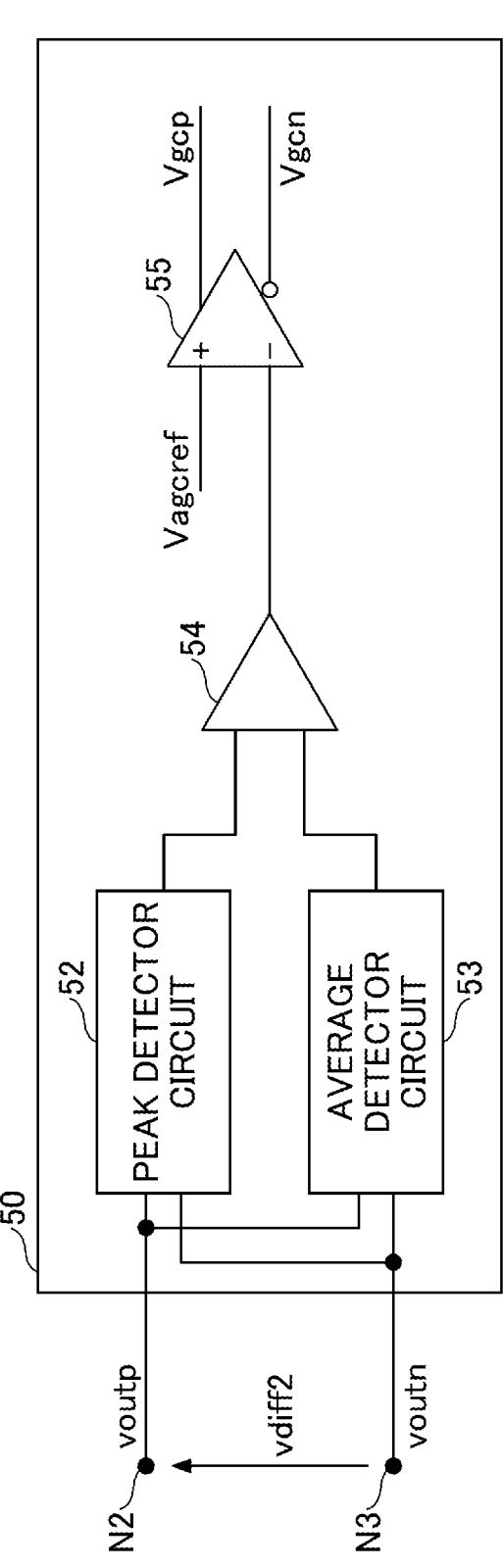
FIG. 10 is a diagram illustrating an example of a configuration of the control circuit.

FIG. 10 illustrates an example of a configuration of the control circuit. The control circuit 50 includes a peak detector circuit 52, an average detector circuit 53, an amplifier 54, and a differential amplifier circuit 55. The control circuit 50 includes a node N2 and a node N3 for receiving the paired voltage signals voutp and voutn. The peak detector circuit 52 includes, for example, a non-inverted input terminal and an inverted input terminal. The average detector circuit 53 includes, for example, a non-inverted input terminal and an inverted input terminal. The non-inverted input terminal of the peak detector circuit 52 and the non-inverted input terminal of the average detector circuit 53 are connected to the node N2. The inverted input terminal of the peak detector circuit 52 and the inverted input terminal of the average detector circuit 53 are connected to the node N3. For example, the first voltage signal voutp is input into the node N2, and the second voltage signal voutn is input into the node N3.

The peak detector circuit 52 detects a peak value of the first voltage signal voutp and the second voltage signal voutn, and outputs a voltage having a magnitude corresponding to the detected peak value. The average detector circuit 53 detects an average value (a magnitude of the DC component) of the first voltage signal voutp and the second voltage signal voutn, and outputs a voltage having a magnitude corresponding to the detected average value. The amplifier 54 outputs a voltage (corresponding to half of the amplitude value of the first voltage signal voutp and the second voltage signal voutn) corresponding to the difference between the output voltage (peak voltage value) of the peak detector circuit 52 and the output voltage (average value) of the average detector circuit 53. The amplifier 54 is, for example, a differential amplifier circuit, and outputs one of the differential outputs (e.g., the positive-phase component). Therefore, the voltage output by the amplifier 54 is a voltage according to the amplitude values of the first voltage signal voutp and the second voltage signal voutn.

The differential amplifier circuit 55 compares the voltage output by the amplifier 54 with a reference voltage Vagcref. When the voltage output by the amplifier 54 is lower than the reference voltage Vagcref, the differential amplifier circuit 55 increases the first control voltage Vgcp and decreases the second control voltage Vgcn, to increase the gain of the receiver circuit 101 (increase the amplitude of the difference between the positive-phase output current icbp and the reversed-phase output current icbn). Meanwhile, when the voltage output by the amplifier 54 is higher than the reference voltage Vagcref, the differential amplifier circuit 55 decreases the first control voltage Vgcp and increases the second control voltage Vgcn, to decrease the gain of the receiver circuit 101 (decrease the amplitude of the difference between the positive-phase output current icbp and the reversed-phase output current icbn). Accordingly, the amplitudes of the paired voltage signals voutp and voutn are limited so as not to be greater than a value set according to the reference voltage Vagcref. In other words, when the amplitude of the paired voltage signals voutp and voutn approaches a value set according to the reference voltage Vagcref, the amplitude is maintained within a predetermined control error range with respect to the reference voltage Vagcref. Note that, regarding the "gain" referred to in the above description, the amplitudes of the third paired current signals icbp and icbn are set to be equivalent to or smaller than the amplitudes of the first paired current signals iinp and iinn. The amplitude of the first paired current signals iinp and iinn corresponds to the amplitude of the difference (difference current) between the first input current iinp and the second input current iinn. The amplitude of the third paired current signals icbp and icbn corresponds to the difference (difference current) between the positive-phase output current icbp and the reversed-phase output current icpn.

Figure 11:
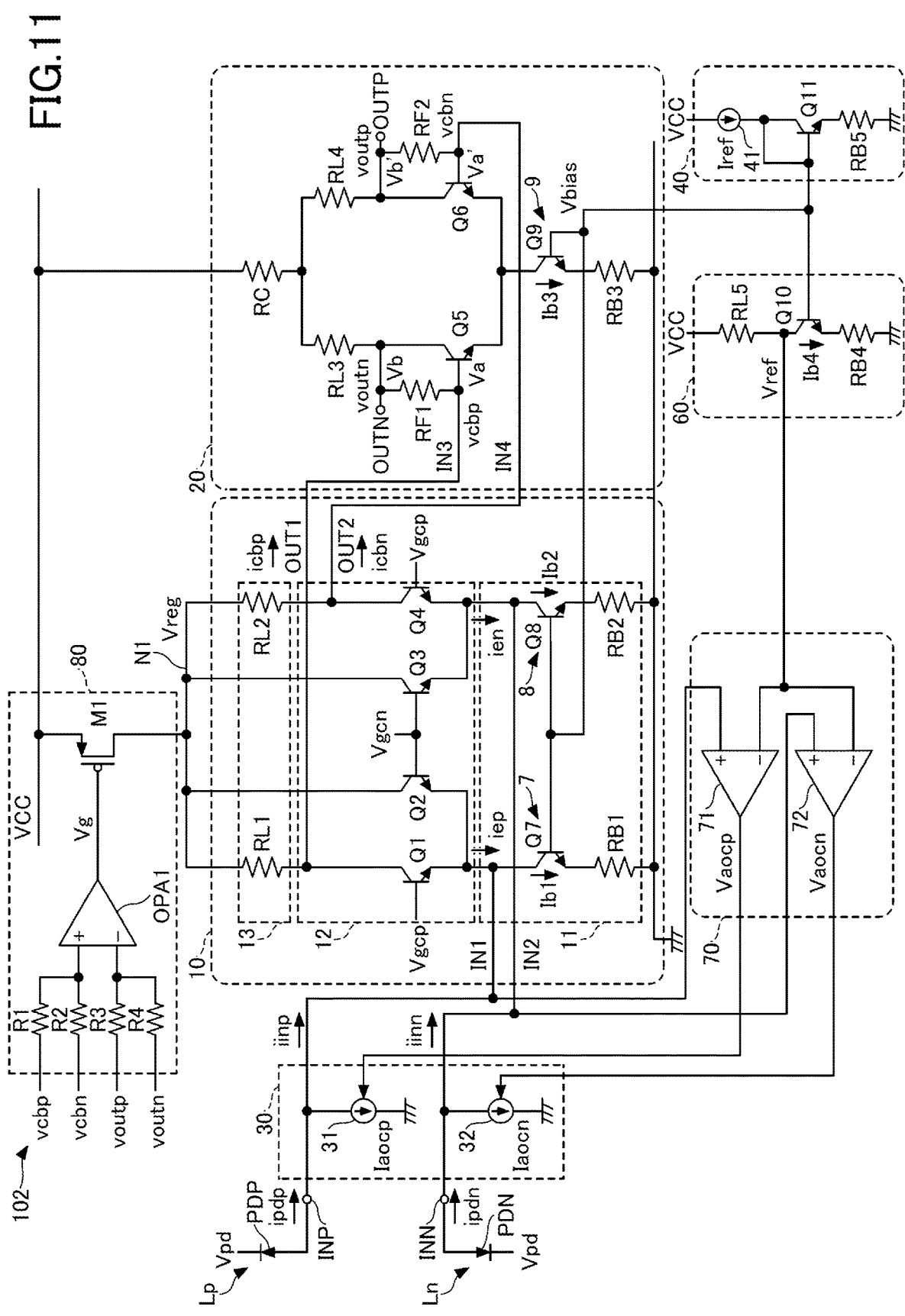
FIG. 11 is a diagram illustrating an example of a configuration of a receiver circuit according to a second embodiment.

FIG. 11 is a diagram illustrating an example of a configuration of a receiver circuit according to a second embodiment. In the second embodiment, description of substantially the same elements, operations, and effects as in the first embodiment are omitted or simplified by referring to the above description. A receiver circuit 102 illustrated in FIG. 11 is an example of the receiver circuit 100 (FIG. 1).

In FIG. 11 (second embodiment), the first current source 7, the second current source 8, and the third current source 9 are illustrated by transistors and resistors, respectively, in contrast to FIG. 2 (first embodiment). In addition, a reference current circuit 40 that supplies the base voltage (bias voltage Vbias) and the base current of the transistors of the first current source 7, the second current source 8, and the third current source 9 is illustrated. In addition, an AOC (Automatic Offset Control) circuit 70 that generates the first feedback control voltage Vaocp and the second feedback control voltage Vaocn by two operational amplifiers 71 and 72 is illustrated. The AOC circuit 70 is an example of a feedback control circuit. In addition, a reference voltage circuit 60 that generates a reference voltage Vref for the AOC circuit 70 is illustrated. The base voltage (input voltage) of the transistor Q10 of the reference voltage circuit 60 is supplied from the reference current circuit 40. A fourth constant current Ib4 flows between the collector and the emitter of the transistor Q10.

The receiver circuit 102 further includes the reference current circuit 40, the reference voltage circuit 60, the current pull-out circuit 30, and the AOC circuit 70.

The reference current circuit 40 generates a reference current Iref. The reference current circuit 40 includes a series circuit of a current source 41, a transistor Q11, and a resistor RB5. The first current source 7 includes a first transistor Q7 that supplies the first constant current Ib1, and a resistor element RB1 that is connected in series to the emitter of the first transistor Q7. The second current source 8 includes a second transistor Q8 that supplies the second constant current Ib2, and a resistor element RB2 that is connected in series to the emitter of the second transistor Q8. As the first current source 7 and the second current source 8 serve as a pair of current sources forming a differential circuit, it is favorable that, for example, the second transistor Q8 has the same electrical characteristics as the electrical characteristics of the first transistor Q7. The third current source 9 includes a third transistor Q9 that supplies the third constant current Ib3, and a resistor element RB3 that is connected in series to the emitter of the third transistor Q9.

The resistor elements RB1, RB2, and RB3 are connected to the ground wire. The reference current circuit 40 supplies a DC bias voltage Vbias (and a DC bias current) to the respective bases of the first transistor Q7, the second transistor Q8, and the third transistor Q9 so as to make the first constant current Ib1, the second constant current Ib2, and the third constant current Ib3 equivalent to the reference current Iref.

In the current pull-out circuit 30, the first current signal ipdp is input via the first input terminal INP, and the second current signal ipdn is input via the second input terminal INN. The current pull-out circuit 30 pulls out (or subtracts) a first direct current Iaocp (also referred to as the first feedback current) from the first current signal ipdp, and pulls out a second direct current Iaocn (also referred to as the second feedback current) from the second current signal ipdn, to generate first paired current signals iinp and iinn. The first paired current signals iinp and iinn may be treated as a first differential current signal. For example, the current signal iinp is a positive-phase component of the first differential current signal and the current signal iinn is a negative-phase component of the first differential current signal. The current signal iinp can be expressed by an equation iinp=ipdp−Iaocp. The current signal iinn can be expressed by an equation iinn=ipdn−Iaocn. The current pull-out circuit 30 pulls out the first feedback current Iaocp from the first current signal ipdp, to generate the first input current iinp as the positive-phase component of the first paired current signals iinp and iinn. The current pull-out circuit 30 pulls out the second feedback current Iaocn from the second current signal ipdn, to generate the second input current iinn as the reversed-phase component of the first paired current signals iinp and iinn.

The first current signal ipdp includes an alternate current component that changes with time for information transmission, and a direct current component (DC component) corresponding to a time-averaged value. By making the magnitude of the first feedback current Iaocp equivalent to the magnitude of the DC component of the first current signal ipdp, the first input current iinp becomes equivalent to the AC component of the first current signal ipdp. In addition, the second current signal ipdn includes an alternate current component that changes with time for information transmission and a DC component corresponding to a time-averaged value. By making the magnitude of the second feedback current Iaocn equivalent to the magnitude of the DC component of the second current signal ipdn, the second input current iinn becomes equivalent to the AC component of the second current signal ipdn. In other words, the current pull-out circuit 30 generates first paired current signals iinp and iinn from the first current signal ipdp and the second current signal ipdn, by excluding the respective DC components.

The current pull-out circuit 30 includes a first pull-out current source 31 that generates the first feedback current Iaocp, and a second pull-out current source 32 that generates the second feedback current Iaocn. The first pull-out current source 31 changes the value of the first feedback current Iaocp according to the value of the first feedback control voltage Vaocp to be input. The second pull-out current source 32 changes the value of the second feedback current Iaocn according to the value of the second feedback control voltage Vaocn to be input.

When the input signal (first differential current signal iinp, iinn) of the differential amplitude adjuster circuit 10 includes a DC component, the node voltages Va and Va' deviate from the optimum values. By the current pull-out circuit 30 pulling out the DC component according to the first feedback control voltage Vaocp and the second feedback control voltage Vaocn, deviation from the optimum values of Va, Va' is suppressed. Accordingly, the fluctuation of the frequency characteristics when changing the current gain can be further suppressed.

The AOC circuit 70 controls pulling-out of the first feedback current Iaocp and the second feedback current Iaocn so as to make the DC voltage of the first input terminal INP (the first input node IN1) equivalent to the DC voltage of the second input terminal INN (the second input node IN2). In this example, the AOC circuit 70 controls pulling-out of the first feedback current Iaocp and the second feedback current Iaocn so as to make each of the first DC voltage and the second DC voltage equivalent to the voltage value of the reference voltage Vref. The AOC circuit 70 generates the first feedback control voltage Vaocp and the second feedback control voltage Vaocn by negative feedback control according to the respective differences between the first and second DC voltages, and the reference voltage Vref. Accordingly, the first and second DC voltages are maintained at the reference voltage Vref. By the operations of the AOC circuit 70 and the current pull-out circuit 30, the DC currents of the first photodetector element PDP and the second photodetector element PDN are controlled so as not to be input into the differential amplitude adjuster circuit 10, and the deviation of the operating point from the optimum state is suppressed. Accordingly, the fluctuation of the frequency characteristics when changing the current gain can be suppressed.

In this example, the first pull-out current source 31 is connected to the first input terminal INP (or the first input node IN1), and the second pull-out current source 32 is connected to the second input terminal INN (or the second input node IN2). The first pull-out current source 31 can split the first feedback current Iaocp from the first current signal ipdp to the ground, and the second pull-out current source 32 can split the second feedback current Iaocn from the second current signal ipdn to the ground.

The AOC circuit 70 controls the DC split flow from the first current signal ipdp by adjusting the first feedback control voltage Vaocp, and controls the DC split flow from the second current signal ipdn by adjusting the second feedback control voltage Vaocn.

In the case where the first DC voltage of the first input terminal INP (or the first input node IN1) is higher than the reference voltage Vref, the AOC circuit 70 increases the first feedback control voltage Vaocp to increase the first feedback current Iaocp. Accordingly, as the DC component of the first input current iinp is reduced, feedback control is executed to reduce the first DC voltage of the first input terminal INP (or the first input node IN1). On the other hand, for example, when the intensities of the first optical signal Lp and the second optical signal Ln are reduced, the first DC voltage of the first input terminal INP (or the first input node IN1) becomes lower than the reference voltage Vref; therefore, the AOC circuit 70 reduces the first feedback control voltage Vaocp to reduce the first feedback current Iaocp. Accordingly, the first feedback current Iaocp is not excessively pulled out from the first input current iinp, and thereby, feedback control is executed that increases the first DC voltage of the first input terminal INP (or the first input node IN1). Accordingly, the feedback control is executed so as to maintain the first DC voltage at the reference voltage Vref. Similarly, for the second DC voltage of the second input terminal INN (or the second input node IN2), feedback control is executed so as to maintain the second DC voltage at the reference voltage Vref.

In this way, the feedback control is executed so that the first DC voltage and the second DC voltage take the same target value (reference voltage Vref). Accordingly, for example, even if there is an imbalance (characteristic variation) between the first photodetector element PDP and the second photodetector element PDN, or between the pair of transistors Q7 and Q8 of the constant current circuit 11, an amplification operation with a small output offset can be executed. The output offset is a difference between the DC component of the first voltage signal voutp and the DC component of the second voltage signal voutn.

The first pull-out current source 31 and the second pull-out current source 32 are circuits formed using, for example, n-type FETs. For example, the first pull-out current source 31 has an n-type FET having its drain connected to a wire connecting the first input terminal INP and the first input node IN1, and its source connected to the ground. The gate of the n-type FET is connected to the output of the operational amplifier 71 into which the voltage of the first input node IN1 and the reference voltage Vref are input. Similarly, for example, the second pull-out current source 32 has an n-type FET having its drain connected to a wire connecting the second input terminal INN and the second input node IN2, and its source connected to the ground. The gate of the n-type FET is connected to the output of the operational amplifier 72 into which the voltage of the second input node IN2 and the reference voltage Vref are input. The reference voltage Vref is set to the same value as, for example, the DC voltage of the first input node IN1 when the first feedback current Iaocp is 0.

The gains of the operational amplifiers 71 and 72 simply need to be great enough, for example, around several thousand, which is the gain of a typical operational amplifier.

Figure 12:
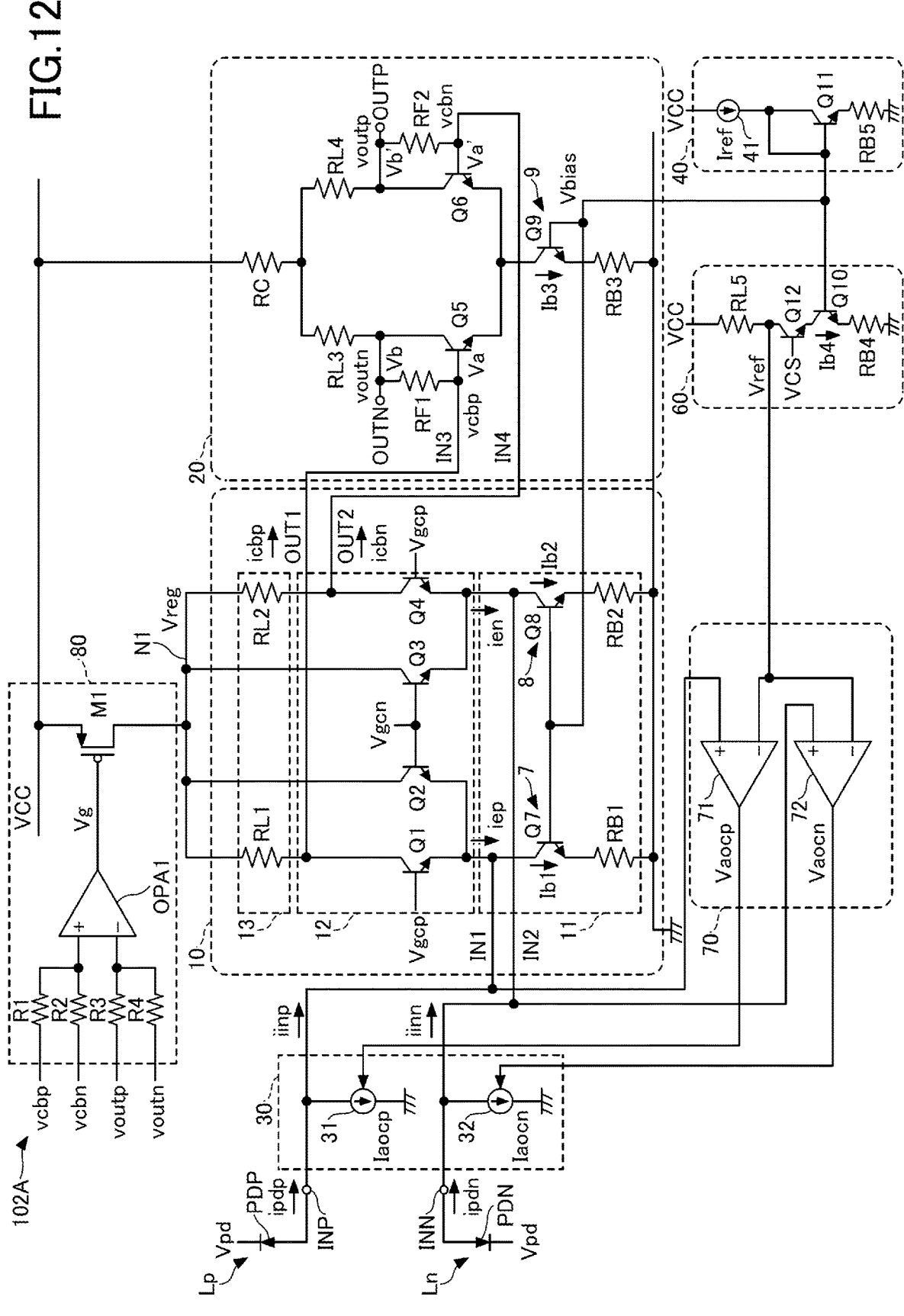
FIG. 12 is a diagram illustrating an example of a configuration of a receiver circuit according to a third embodiment.

FIG. 12 is a diagram illustrating an example of a configuration of a receiver circuit according to a third embodiment. In the third embodiment, description of substantially the same elements, operations, and effects as in the first and second embodiments are omitted or simplified by referring to the above description. A receiver circuit 102A illustrated in FIG. 12 is an example of the receiver circuit 100 (FIG. 1).

In the reference voltage circuit 60 in FIG. 12 (third embodiment), a transistor Q12 is added to the reference voltage circuit 60 in FIG. 11 (second embodiment), wherein the bias voltage VCS is input into the base. By adding the transistor Q12, the connection configuration between the power supply wire VCC and the ground in the reference voltage circuit 60 matches the connection configuration between the power supply wire VCC and the ground in the differential amplitude adjuster circuit 10. In other words, from the power supply wire VCC toward the ground wire, the load resistor elements RL5 correspond to the positions of the load resistor elements RL1 and RL2, the transistors Q12 correspond to the positions of the transistors Q1, Q2, Q3 and Q4, the transistors Q10 correspond to the positions of the transistors Q7 and Q8, and the resistor elements RB4 correspond to the positions of the resistor elements RB1 and RB2. In this way, by matching both circuit configurations, movement of the reference voltage Vref and the node voltages Va and Va' in response to the fluctuation in temperature or power supply voltage can be matched, and hence, compensation operations can be executed with high accuracy. Accordingly, the fluctuation of the frequency characteristics when changing the gain can be more suppressed.

In the configuration in FIG. 12, the current splitter circuit 12 includes a transistor Q1 connected between the first load resistor element RL1 and the transistor Q7, and a transistor Q4 connected between the second load resistor element RL2 and the transistor Q8. Meanwhile, the reference voltage circuit 60 includes a transistor Q10 whose base is connected to the bases of the transistors Q7, Q8, and Q9, and a transistor Q12 connected between the load resistor element RL5 and the transistor Q10. Accordingly, the reference voltage circuit 60 has the same connection configuration between the power supply wire VCC and the ground as the connection configuration between the power supply wire VCC and the ground in the differential amplitude adjuster circuit 10.

In addition, in the configuration in FIG. 12, the load circuit 13 includes the first load resistor element RL1 connected between the power supply wire VCC and the transistor Q1, and the second load resistor element RL2 connected between the power supply wire VCC and the transistor Q4. The constant current circuit 11 includes the resistor element RB1 connected between the ground wire and the transistor Q7, and the resistor element RB2 connected between the ground wire and the transistor Q8. Meanwhile, the reference voltage circuit 60 includes the load resistor element RL5 connected between the power supply wire VCC and the transistor Q12, and the resistor element RB4 connected between the ground wire and the transistor Q10. Accordingly, the reference voltage circuit 60 has the same connection configuration between the power supply wire VCC and the ground as the connection configuration between the power supply wire VCC and the ground in the differential amplitude adjuster circuit 10.

Figure 13:
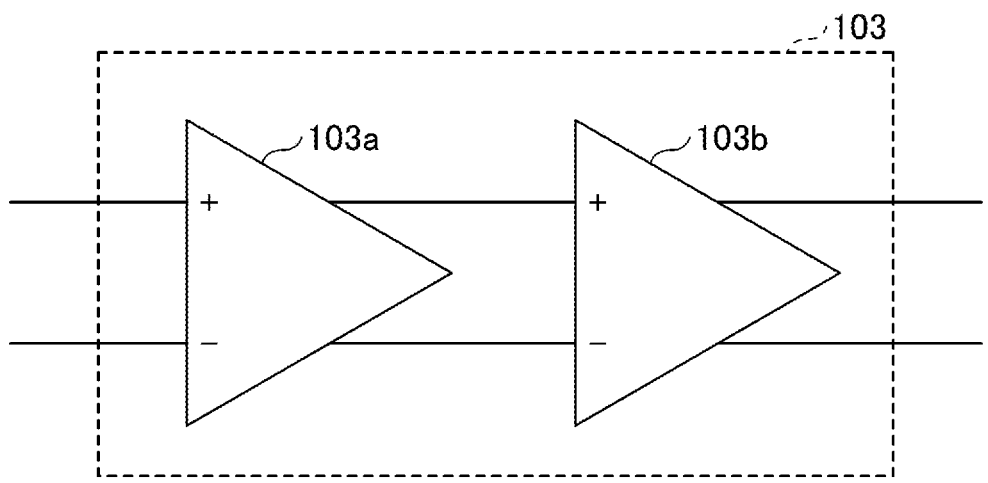
FIG. 13 is a diagram illustrating an example of a configuration of a receiver circuit according to a fourth embodiment.

FIG. 13 is a diagram illustrating an example of a configuration of a receiver circuit according to a fourth embodiment. In the fourth embodiment, the description of the elements, operations and effects substantially the same as those in the embodiments described above are omitted or simplified by using the above description. A receiver circuit 103 illustrated in FIG. 13 is an example of the receiver circuit 100 (FIG. 1).

The receiver circuit 103 includes a differential transimpedance amplifier 103a and a differential amplifier circuit 103b.

Any one of the receiver circuits of the above embodiments may be applied to the differential transimpedance amplifier 103a, or a known configuration of a differential transimpedance amplifier may be applied. The differential transimpedance amplifier 103a is a circuit that converts paired currents (a differential current) into paired voltages (a differential voltage). The differential amplifier circuit 103b amplifies the paired voltages output from the differential transimpedance amplifier 103a and outputs the amplified paired voltages as paired voltage signals.

Figure 14:
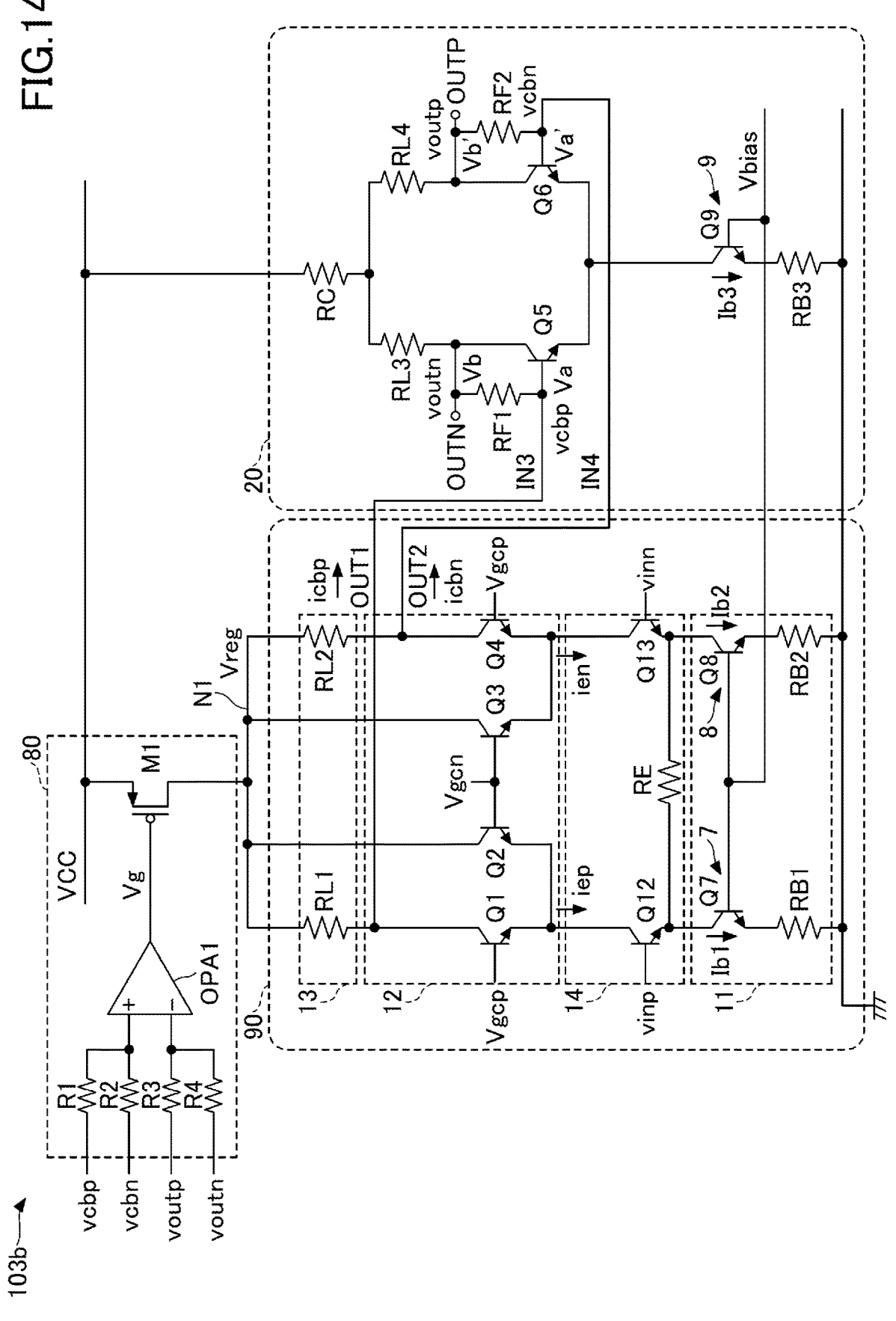
FIG. 14 is an example of a differential amplifier circuit included in a receiver circuit according to the fourth embodiment.

FIG. 14 is an example of the differential amplifier circuit 103b included in the receiver circuit according to the fourth embodiment. The differential amplifier circuit 103b includes a differential OTA circuit 90, a differential TIA circuit 20, and a voltage regulator circuit 80. OTA is an abbreviation of Operational Transconductance Amplifier. The differential OTA circuit 90 generates paired current signals icbp and icbn according to the paired voltage signals vinp and vinn. The differential TIA circuit 20 and the voltage regulator circuit 80 of the third embodiment may have the same configuration as the differential TIA circuit 20 and the voltage regulator circuit 80 of the first or second embodiment. The differential OTA circuit 90 of the fourth embodiment further includes a differential pair circuit 14 constituted with transistors Q12, Q13 and a resistor element RE, and in these regards, differs from the differential amplitude adjuster circuit 10 of the embodiments described above.

The differential pair circuit 14 is connected between the constant current circuit 11 and the current splitter circuit 12. The differential pair circuit 14 converts the paired voltage signals vinp and vinn supplied from the differential transimpedance amplifier 103a into the paired current signals iep and ien. The differential pair circuit 14 includes the transistor Q12 arranged at the first input node, the transistor Q13 arranged at the second input node, and the resistor element RE connected between the emitter of the transistor Q12 and the emitter of the transistor Q13.

The transistor Q12 includes a base receiving the positive-phase voltage vinp as the positive-phase component of the paired voltage signals vinp and vinn, a collector connected to the emitter of the transistor Q1, and an emitter connected to the collector of the transistor Q7. The transistor Q13 includes a base receiving the reversed-phase voltage vinn as the reversed-phase component of the paired voltage signals vinp and vinn, a collector connected to the emitter of the transistor Q4, and an emitter connected to the collector of the transistor Q8.

By having the differential pair circuit 14, the differential OTA circuit 90 operates as a variable gain differential amplifier circuit having a small fractionation of the frequency characteristics in a wide band.

What is claimed is:

1. A receiver circuit comprising:
a constant current circuit that includes a first input node and a second input node into which first paired current signals are input, a first current source connected to the first input node, and a second current source connected to the second input node, wherein the receiver circuit is configured to generate second paired current signals in accordance with the first paired current signals;
a current splitter circuit configured to generate third paired current signals from the second paired current signals, wherein the current splitter circuit includes a first output node and a second output node configured to output the third paired current signals, and sets amplitudes of the third paired current signals to be smaller than amplitudes of the second paired current signals in accordance with a first control voltage and a second control voltage;
a DC voltage node;
a load circuit that includes a first load resistor element and a second load resistor element, wherein the first load resistor element is connected between the DC voltage node and the first output node and the second load resistor element is connected between the DC voltage node and the second output node;
a differential transimpedance amplifier circuit that includes a third input node and a fourth input node into which the third paired current signals are input, a first output terminal and a second output terminal configured to output paired voltage signals, a first feedback resistor element connected between the third input node and the second output terminal, and a second feedback resistor element connected between the fourth input node and the first output terminal, to generate the paired voltage signals in accordance with the third paired current signals; and a voltage regulator circuit that includes an FET connected between a power supply wire and the DC voltage node, and is configured to adjust a gate voltage of the FET so as to reduce at least a difference in respective average potentials of the first output node, the second output node, the first output terminal, and the second output terminal.

2. The receiver circuit as claimed in claim 1, wherein the first current source supplies a first current, wherein the second current source supplies a second current, wherein the second current has a current value that is equivalent to a current value of the first current, wherein the second load resistor element has a resistance value equivalent to a resistance value of the first load resistor element, wherein the differential transimpedance amplifier circuit further includes a third current source, a third load resistor element, and a fourth load resistor element, wherein the third current source supplies a third current, wherein the fourth load resistor element has a resistance value equivalent to a resistance value of the third load resistor element, and wherein the third current is equivalent to a sum of an average current flowing through the third load resistor element and an average current flowing through the fourth load resistor element.

3. The receiver circuit as claimed in claim 2, wherein the differential transimpedance amplifier circuit further includes a fifth load resistor element, and wherein the fifth load resistor element has one end connected to the third load resistor element and the fourth load resistor element, and has another end connected to the power supply wire.

4. A receiver circuit comprising:

a first input node;

a second input node;

a constant current circuit that includes a first transistor and a second transistor, wherein the first input node is connected to a collector of the first transistor, and the second input node is connected to a collector of the second transistor;

a DC voltage node;

a current splitter circuit that includes a third transistor, a fourth transistor, a fifth transistor, and a sixth transistor, wherein an emitter of the third transistor and an emitter of the fourth transistor are connected to the first input node, an emitter of the fifth transistor and an emitter of the sixth transistor are connected to the second input node, a collector of the fourth transistor and a collector of the fifth transistor are connected to the DC voltage node, a base of the third transistor and a base of the sixth transistor receive a first control signal, and a base of the fourth transistor and a base of the fifth transistor receive a second control signal;

a load circuit that includes a first load resistor element and a second load resistor element, wherein the first load resistor element is connected between the DC voltage node and a collector of the third transistor, and the second load resistor element is connected between the DC voltage node and a collector of the sixth transistor;

a differential transimpedance amplifier circuit that includes a seventh transistor, an eighth transistor, a ninth transistor, a first feedback resistor element, a second feedback resistor element, a third load resistor element, a fourth load resistor element, and a fifth load resistor element, wherein a base of the seventh transistor is connected to the first load resistor element, a base of the eighth transistor is connected to the second load resistor element, an emitter of the seventh transistor and an emitter of the eighth transistor are connected to a collector of the ninth transistor, the first feedback resistor element is connected between a collector and the base of the seventh transistor, the second feedback resistor element is connected between a collector and the base of the eighth transistor, the third load resistor element is connected between the fifth load resistor element and the seventh transistor, and the fourth load resistor element is connected between the fifth load resistor element and the eighth transistor;

a first output terminal connected to the collector of the eighth transistor;

a second output terminal connected to the collector of the seventh transistor; and a voltage regulator circuit that includes an FET connected between a power supply wire and the DC voltage node, and is configured to adjust a gate voltage of the FET so as to reduce at least a difference in respective average potentials of the collector of the third transistor, the collector of the sixth transistor, the collector of the seventh transistor, and the collector of the eighth transistor.

5. The receiver circuit as claimed in claim 4, wherein the voltage regulator circuit includes a first input resistor element, a second input resistor element, a third input resistor element, a fourth input resistor element, and an operational amplifier, wherein the first input resistor element is connected between the collector of the third transistor and a non-inverted input terminal of the operational amplifier, wherein the second input resistor element is connected between the collector of the sixth transistor and the non-inverted input terminal of the operational amplifier, wherein the third input resistor element is connected between the collector of the eighth transistor and an inverted input terminal of the operational amplifier, wherein the fourth input resistor element is connected between the collector of the seventh transistor and the inverted input terminal of the operational amplifier, and wherein an output of the operational amplifier is electrically connected to a gate of the FET.

6. The receiver circuit as claimed in claim 1, wherein the differential transimpedance amplifier circuit has an input impedance lower than resistance values of the first load resistor element and the second load resistor element.

7. The receiver circuit as claimed in claim 1, further comprising:

a reference voltage circuit configured to generate a reference voltage;

a current pull-out circuit that includes a first pull-out current source connected to a first input terminal connected to the first input node and a second pull-out current source connected to a second input terminal connected to the second input node, wherein the first pull-out current source pulls out a first feedback current from the first current signal input from the first input terminal, and the second pull-out current source pulls out a second feedback current from the second current signal input from the second input terminal; and a feedback control circuit configured to control pulling out the first feedback current and the second feedback current so as to make a DC voltage of the first input terminal and a DC voltage of the second input terminal equivalent to the reference voltage.

8. The receiver circuit as claimed in claim 4, further comprising:

a reference current circuit configured to generate a reference current, wherein the reference current circuit supplies a bias voltage to a base of the first transistor, a base of the second transistor, and the base of the third transistor.

9. The receiver circuit as claimed in claim 8, wherein the reference current circuit includes a tenth transistor, wherein a collector of the tenth transistor is connected to a base of the tenth transistor, and wherein the base of the tenth transistor is connected to the base of the first transistor, the base of the second transistor, and the base of the third transistor.

10. The receiver circuit as claimed in claim 8, further comprising:

a reference voltage circuit configured to generate a reference voltage according to the bias voltage;

a current pull-out circuit that includes a first pull-out current source connected to a first input terminal connected to the first input node and a second pull-out current source connected to a second input terminal connected to the second input node, wherein the first pull-out current source pulls out a first feedback current from the first current signal input from the first input terminal, and the second pull-out current source pulls out a second feedback current from the second current signal input from the second input terminal; and a feedback control circuit configured to control pulling out the first feedback current and the second feedback current so as to make the DC voltage of the first input terminal and the DC voltage of the second input terminal equivalent to the reference voltage.

11. The receiver circuit as claimed in claim 10, wherein the reference voltage circuit includes an eleventh transistor and a twelfth transistor, wherein a base of the eleventh transistor is connected to the base of the first transistor, the base of the second transistor, and the base of the third transistor, and wherein a collector of the eleventh transistor is connected to an emitter of the twelfth transistor.

12. The receiver circuit as claimed in claim 1, further comprising:

a differential transimpedance amplifier configured to convert paired currents into paired voltages; and a differential amplifier circuit configured to amplify the paired voltages, wherein the differential amplifier circuit includes the constant current circuit, the current splitter circuit, the DC voltage node, the load circuit, the differential transimpedance amplifier circuit, the voltage regulator circuit, and a differential pair circuit, wherein the differential pair circuit includes a thirteenth transistor arranged at the first input node, a fourteenth transistor arranged at the second input node, and a resistor element connected between an emitter of the thirteenth transistor and an emitter of the fourteenth transistor, and wherein a base of the thirteenth transistor and a base of the fourteenth transistor receive the paired voltages.

13. An optical receiver circuit comprising:

a first photodetector element configured to generate a first current signal according to a first optical signal;

a second photodetector element configured to generate a second current signal according to a second optical signal; and the receiver circuit as claimed in claim 1.

* * * * *